(12) United States Patent
Sugawara

(10) Patent No.: US 7,170,683 B2
(45) Date of Patent: Jan. 30, 2007

(54) REFLECTION ELEMENT OF EXPOSURE LIGHT AND PRODUCTION METHOD THEREFOR, MASK, EXPOSURE SYSTEM, AND PRODUCTION METHOD OF SEMICONDUCTOR DEVICE

(75) Inventor: Minoru Sugawara, Kanagawa (JP)

(73) Assignee: Sony Corporation (JP)

( * ) Notice: Subject to any disclaimer, the term of this patent is extended or adjusted under 35 U.S.C. 154(b) by 220 days.

(21) Appl. No.: 10/510,725

(22) PCT Filed: Apr. 18, 2003

(86) PCT No.: PCT/JP03/05000

§ 371 (c)(1),
(2), (4) Date: Oct. 8, 2004

(87) PCT Pub. No.: WO03/089964

PCT Pub. Date: Oct. 30, 2003

(65) Prior Publication Data

US 2005/0151095 A1    Jul. 14, 2005

(30) Foreign Application Priority Data

Apr. 22, 2002 (JP) ............................. 2002-118941

(51) Int. Cl.
*G02B 1/10* (2006.01)
(52) U.S. Cl. ...................... 359/584; 359/587; 359/590
(58) Field of Classification Search ................ 359/584, 359/587, 589, 590
See application file for complete search history.

(56) References Cited

U.S. PATENT DOCUMENTS 6,333,961 B1    12/2001   Murakami

2003/0043866 A1 *  3/2003  Baillargeon et al. .......... 372/32
2005/0079333 A1 *  4/2005  Wheatley et al. ............ 428/212
2005/0201442 A1 *  9/2005  Luo et al. .................... 372/69

FOREIGN PATENT DOCUMENTS

JP    2001-27699 A    1/2001
JP    2001-237174 A   8/2001

OTHER PUBLICATIONS

International Search Report dated Jul. 29, 2003.
Communication from European Patent Office of Application No. 03 723 149.5-1234 dated Sep. 28, 2006.

* cited by examiner

*Primary Examiner*—Fayez G. Assaf
(74) *Attorney, Agent, or Firm*—Rader, Fishman & Grauer PLLC; Ronald P. Kananen

(57) ABSTRACT

A reflector for extreme ultraviolet light, its manufacture method, a phase shift mask, an exposure apparatus and a semiconductor manufacture method, capable of making the wavelength dependency of a reflectance via a plurality of reflection surfaces be coincident with an center wavelength of exposure light and retaining a sufficient energy reaching a subject to be exposed. The reflector for exposure light to be used for exposure of a subject to be exposed in a lithography process of manufacturing a semiconductor device is configured to have a multi-layer film structure made by repetitively stacking a plurality of layers in the same order. The periodical length of the repetitive stack unit of the multi-layer film structure is set in such a manner that the center of full width at half maximum of the reflectance via a predetermined number of reflectors becomes coincident with the center wavelength of extreme ultraviolet light to be reflected (S102).

20 Claims, 22 Drawing Sheets

REFLECTION ELEMENT OF EXPOSURE LIGHT AND PRODUCTION METHOD THEREFOR, MASK, EXPOSURE SYSTEM, AND PRODUCTION METHOD OF SEMICONDUCTOR DEVICE

TECHNICAL FIELD

The present invention relates to a reflector for exposure light having a function of reflecting exposure light, such as mask blanks of exposure masks and reflection mirrors, the reflector being used when a circuit pattern is transferred by exposure light to a subject to be exposed such as a wafer in a lithograph process of manufacturing a semiconductor device, and to a reflector manufacture method. The present invention also relates to a mask having a function of reflecting exposure light. The present invention also relates to an exposure apparatus constituted of exposure light reflectors. The present invention also relates to a semiconductor device manufacture method using an exposure light mask.

BACKGROUND ART

Recent fine semiconductor devices require the minimization of a pattern width (line width), a pitch between patterns and the like of a circuit pattern to be formed on a wafer and or a resist pattern for forming the circuit pattern and the like. This minimization requirement can be dealt with by shortening the wavelength of ultraviolet light to be used as exposure light to resist. As miniaturization of semiconductor devices progresses more, the wavelength of ultraviolet light to be used as exposure light is shortened to, for example, a wavelength of 365 nm for semiconductor devices under a 350 nm design rule, a wavelength of 248 nm for semiconductor devices under a 250 nm and 180 nm design rule, and a wavelength of 193 nm for semiconductor devices under a 130 nm and 100 nm design rule, ultraviolet light having a wavelength of 157 nm being now in use.

It is known that a resolution relative to a wavelength is generally expressed by the Rayleigh's equation $w=k1\times(\lambda/NA)$ where w is a minimum width pattern to be resolved, NA is a numerical aperture of a lens in a projection optical system, $\lambda$ is a wavelength of exposure light and k1 is a process constant. The process constant is determined mainly by the performance of resist, selection of ultra resolution techniques and the like. It is known that k1 can be selected to be about 0.35 if optimum resist and ultra resolution techniques are used. According to the ultra resolution techniques, ± first order refraction light of light transmitted through a mask and refracted by a mask light shielding pattern is selectively used to obtain a pattern smaller than the wavelength.

It can be known from the Rayleigh's equation that the minimum pattern width capable of being dealt with if a wavelength of, for example, 157 nm is used, is w=61 nm by using a lens with NA=0.9. Namely, if a pattern width narrower than 61 nm is to be obtained, it is necessary to use ultraviolet light having a wavelength shorter than 157 nm.

For this reason, studies have been made recently to use light having a wavelength of 13.5 nm called extreme ultraviolet (EUV; Extreme Ultra Violet) light as ultraviolet light having a wavelength shorter than 157 nm. Since there is light transmission material such as $CaF_2$ (calcium fluoride) and $SiO_2$ (silicon dioxide) for ultraviolet light having a wavelength of 157 nm or longer, it is possible to form a mask and an optical system capable of transmitting the ultraviolet light. However, for the extreme ultraviolet light having a wavelength of 13.5 nm, material capable of transmitting the extreme ultraviolet light at a desired thickness does not exist. Therefore, if the extreme ultraviolet light having a wavelength of 13.5 nm is used, a mask and an optical system of a light transmission type cannot be used, but rather a mask and an optical system of a light reflection type is required.

If a mask and an optical system of the light reflection type are used, light reflected from a mask surface is required to be guided to a projection optical system without being interfered with by light incident upon the mask. It is therefore essential that light incident upon the mask is required to be oblique at an angle $\phi$ relative to the normal to the mask surface. This angle is determined from the numerical aperture NA of a lens in a projection optical system, a mask multiplication m and a size $\sigma$ of an illumination light source. Specifically, in an exposure apparatus with NA=0.3 and $\sigma$=0.8, light is incident upon a mask, having a solid angle of 3.44±2.75 degrees. If a mask having a reduction factor of 4 relative to a wafer is used and an exposure apparatus has NA=0.25 and $\sigma$=0.7, light is incident upon the mask, having a solid angle of 3.58±2.51 degrees.

As a reflection type mask for use with oblique incidence light, a mask blank is known which reflects extreme ultraviolet light and has an absorption film covering the mask blank with a predetermined pattern and absorbing extreme ultraviolet light and a buffer film interposed between the mask blank and absorption film. The mask blank has the structure that an Si (silicon) layer and an Mo (molybdenum) layer are alternately stacked, and the repetition number of stacks is generally 40 layers. Since the absorption film for extreme ultraviolet light covers the mask blank with a predetermined pattern, incidence light is selectively reflected in accordance with a circuit pattern to be formed, a resist pattern or the like. The buffer film is formed, as an etching stopper when the absorption film is formed, or in order to avoid damages to be caused when defects are removed after the absorption mask is formed.

As described above, a conventional mask blank has generally 40 layers as the repetition number of stacks of the Si layer and Mo layer. A reflectance of Si is 0.9993–0.00182645i and a reflectance of Mo is 0.9211–0.00643543i, where i is an imaginary unit. It is known that a proper ratio $\Gamma$ of a Mo layer thickness to a total thickness of the Si layer and Mo layer is Mo layer thickness'/(Si layer thickness+Mo layer thickness)=0.4. Therefore, in a conventional mask blank, if the wavelength $\lambda$ of extreme ultraviolet light to be used for exposure is 13.5 nm, the total thickness of the Si layer and Mo layer is $(\lambda/2)/(0.9993\times0.6+0.9211\times0.4)$=6.973 nm, a thickness of the Si layer is 6.9730×0.6=4.184, and a thickness of an Mo layer is 6.9730×0.4=2.789 nm. FIG. 1 shows a reflectance of the mask blank having 40 layers of the stack of the Si layer and Mo layer described above. In the example shown in FIG. 1, the reflectance is at an incidence angle of 4.84 degrees. The incidence angle is defined as an angle relative to the normal to the surface of the mask blank.

The alternately stacked Si layer and Mo layer structure is used not only for a mask blank of the reflection type but also for a reflection mirror constituting a reflection type optical system in quite a similar manner. Namely, the reflection mirror for extreme ultraviolet light has generally 40 layers as the repetition number of stacks of the Si layer and Mo layer, and the reflectance shown in FIG. 1 is obtained by properly setting the thicknesses of the Si layer and Mo layer when the wavelength of extreme ultraviolet light is 13.5 nm.

Extreme ultraviolet light generally propagates via a plurality of reflection surfaces from a light source of an exposure apparatus to resist coated on a wafer, for example, six mirror reflection surfaces of an illumination optical system, six mirror reflection surfaces of a projection optical system and one reflection surface of a mask, thirteen surfaces in total. Extreme ultraviolet light emitted from the light source is attenuated upon reflection at a reflection surface. If this attenuation is large, sufficient energy cannot reach the resist coated on the wafer and there is a possibility that pattern formation and the like cannot be performed properly.

If extreme ultraviolet light propagates via a plurality of reflection surfaces, the energy reaching the resist coated on a wafer can be estimated from a reflectance at each of the plurality of reflection surfaces and a light source intensity. A reflectance R via a plurality of reflection planes is given by the following equation (1) if the light propagates via thirteen reflection surfaces in total. $R_{TE}$ is a reflectance of a TE wave per one reflection surface and $R_{TM}$ is a reflectance of a TM wave per one reflection surface.

$$R=\{(R_{TE}+R_{TM})/2\}^{13} \qquad (1)$$

A reflectance R of thirteen surfaces in total was obtained by using the equation (1) when the mask blank and reflection mirrors having the reflectance shown in FIG. 1 are used. The reflectance R is as shown in FIG. 4. It can be seen from the example shown in FIG. 4 that the center of the half width of a spectrum of the reflectance R is not coincident with 13.5 nm which is the center wavelength of exposure light of extreme ultraviolet light. Namely, even if the center of FWHM (Full Width at Half Maximum) of a reflectance per one reflection surface is coincident with the center wavelength of exposure light (refer to FIG. 1), the center of FWHM of the reflectance R via thirteen reflection surfaces in total is not necessarily coincident with the center wavelength of exposure light and the wavelength dependency may deviate from the center wavelength of exposure light. This results from the fact that the peak wavelength for the reflectance per one reflection surface is not coincident with 13.5 nm which is the center wavelength of exposure light of extreme ultraviolet light. As above, if the wavelength dependency of the reflectance via a plurality of reflection surfaces deviates from the center wavelength of exposure light of extreme ultraviolet light, attenuation at the center wavelength of exposure light, i.e., attenuation of a light source intensity of the light source, becomes large. Therefore, at an exposure light wavelength suitable for resist coated on a wafer, sufficient energy will not reach the wafer and the probability that pattern formation and the like cannot be performed properly becomes very high.

It is therefore an object of the present invention to provide a reflector for exposure light which can retain a sufficient energy reaching a subject to be exposed, by making the wavelength dependency of a reflectance via a plurality of reflection surfaces be coincident with the center wavelength of exposure light such as extreme ultraviolet light.

In a lithography process for manufacturing a semiconductor device, a number (a variety) of exposure masks are used in some cases. Further, if there are a plurality of exposure apparatuses and manufacture is executed at a plurality of factories, a plurality of exposure masks are often used even for the same product and even in the same process. In such cases, it is fairly conceivable that thicknesses of films and the like constituting each of a plurality of exposure masks have manufacturing variations.

The manufacturing variations of this type, i.e., a thickness variation of films and the like constituting each exposure mask, causes a deviation of the center of FWHM of the reflectance relative to extreme ultraviolet light, which may result in a reduction in arrival energy at an exposure light wavelength suitable for resist coated on a wafer. It is therefore desired to remove the variation as much as possible. However, for example, when the productivity of mask blanks is considered, it is not realistic to limit the film thickness and the like too severely.

It is therefore an object of the present invention to provide a reflector for exposure light, its manufacture method, a mask, an exposure apparatus and a semiconductor device manufacture method, which can retain a sufficient energy reaching a subject to be exposed, by making the wavelength dependency of a reflectance via a plurality of reflection surfaces be coincident with the center wavelength of exposure light such as extreme ultraviolet light.

DISCLOSURE OF THE INVENTION

The present invention is a reflector for exposure light devised in order to achieve the above-described objects. The reflector for exposure light is characterized in that it has a multi-layer film structure wherein a plurality of layers are repetitively stacked in the same order, that a periodical length of a repetitive stack unit of the multi-layer film structure is set so that a center of FWHM of a reflectance via a predetermined number of reflectors becomes coincident with a center wavelength of exposure light to be reflected, and that the reflector is used when the exposure light is exposed to a subject to be exposed in a lithography process for manufacture of a semiconductor device.

In addition to the periodical length of the repetitive stack unit of the multi-layer film structure, a film thickness ratio between a plurality of layers constituting the repetitive stack unit may also be set so that the center of FWHM of the reflectance via the predetermined number of reflectors becomes coincident with the center wavelength of exposure light to be reflected.

The present invention is a method of manufacturing a reflector for exposure light devised in order to achieve the above-described object. Namely, the method is characterized in that a multi-layer film structure made by repetitively stacking a plurality of layers in the same order is formed by setting a periodical length of a repetitive stack unit of the multi-layer film structure and a film thickness ratio between a plurality of layers constituting the repetitive stack unit in such a manner that a center of FWHM of a reflectance via a predetermined number of reflectors becomes coincident with a center wavelength of exposure light to be reflected.

The present invention is a mask devised in order to achieve the above-described object and used when exposure light is exposed to a subject to be exposed in a lithography process for manufacture of a semiconductor device. The mask is characterized by including a reflector portion having a multi-layer film structure made by repetitively stacking a plurality of layers in the same order and an absorption film portion covering the reflector portion with a predetermined pattern, wherein the mask is structured so that there is a phase difference between reflection light of exposure light from the reflector portion and reflection light of the exposure light from the absorption film portion, and that in the reflection portion a periodical length of a repetitive stack unit of the multi-layer film structure and a film thickness ratio between the plurality of layers constituting the repetitive stack unit are set so that a center of FWHM of a reflectance via a predetermined number of reflectors becomes coincident with a center wavelength of exposure light to be reflected.

The present invention is an exposure apparatus devised in order to achieve the above-described object and used when exposure light is exposed to a subject to be exposed in a lithography process for manufacture of a semiconductor device. The exposure apparatus is characterized by including a predetermined number of reflectors for exposure light, the reflector having a multi-layer film structure made by repetitively stacking a plurality of layers in the same order, wherein in the reflector for exposure light a periodical length of a repetitive stack unit of the multi-layer film structure and a film thickness ratio between the plurality of layers constituting the repetitive stack unit are set so that a center of FWHM of a reflectance via the predetermined number of reflectors becomes coincident with a center wavelength of exposure light to be reflected.

The present invention is a semiconductor device manufacture method devised in order to achieve the above-described object. The semiconductor device manufacture method is characterized by including a reflector portion having a multi-layer film structure made by repetitively stacking a plurality of layers in the same order and an absorption film portion covering the reflector portion with a predetermined pattern, wherein exposure light is exposed to a subject to be exposed in a lithography process for manufacture of a semiconductor device, by using a mask structured so that there is a phase difference between reflection light of exposure light from the reflector portion and reflection light of the exposure light from the absorption film portion, and that in the reflection portion a periodical length of a repetitive stack unit of the multi-layer film structure and a film thickness ratio of the plurality of layers constituting the repetitive stack unit are set so that a center of FWHM of a reflectance via a predetermined number of reflectors becomes coincident with a center wavelength of exposure light to be reflected.

According to the above-described reflector for exposure light, the periodical length of the repetitive stack unit of the multi-layer film structure is set so that the center of FWHM of the reflectance via a predetermined number of reflectors becomes coincident with the center wavelength of exposure light to be reflected. Therefore, the reflectance of exposure light via the predetermined number of reflectors is coincident with the center wavelength of the exposure light. Accordingly, attenuation of the exposure light intensity can be prevented from becoming large even if the exposure light propagates via the predetermined number of reflectors, and it is possible to retain sufficient arrival energy when exposure to the subject to be exposed is executed.

Further, according to the above-described reflector for exposure light, its manufacture method, mask, exposure apparatus and semiconductor device manufacture method, the periodical length of the repetitive stack unit of the multi-layer film structure and the film thickness ratio among a plurality of layers constituting the repetitive stack unit are set so that the center of FWHM of the reflectance via a predetermined number of reflectors becomes coincident with the center wavelength of exposure light to be reflected. Namely, by setting also the film thickness ratio between a plurality of layers, the center of FWHM of the reflectance becomes coincident with the center wavelength of exposure light even if the total film thickness of the multi-layer film structure is shifted. Accordingly, an allowable variation width of the total film thickness of the multi-layer film structure can be broadened. Even in this case, attenuation of the exposure light intensity can be prevented from becoming large, and it is possible to retain sufficient arrival energy when exposure to the subject to be exposed is executed.

BEST MODE FOR CARRYING OUT THE INVENTION

With reference to the drawings, description will be made on a reflector for extreme ultraviolet light and its manufacture method, a phase shift mask and an exposure apparatus according to the invention. It is obvious that the present invention is not limited to preferred embodiments to be described below.

First, an example of an exposure apparatus will be described. The exposure apparatus described herein is used for exposing a subject (resist on a wafer) to extreme ultraviolet light in a manufacture process for semiconductor devices, particularly in a lithography process of transferring a circuit pattern of a semiconductor device from an exposure mask to a wafer. More specifically, the route from a light source for irradiating extreme ultraviolet light having a center wavelength of 13.5 nm to resist on a wafer which is a subject to be exposed, is structured so that extreme ultraviolet light propagates via thirteen reflection surfaces in total, twelve mirror reflection surfaces of an optical system and one reflection surface of an exposure mask.

Figure 2:
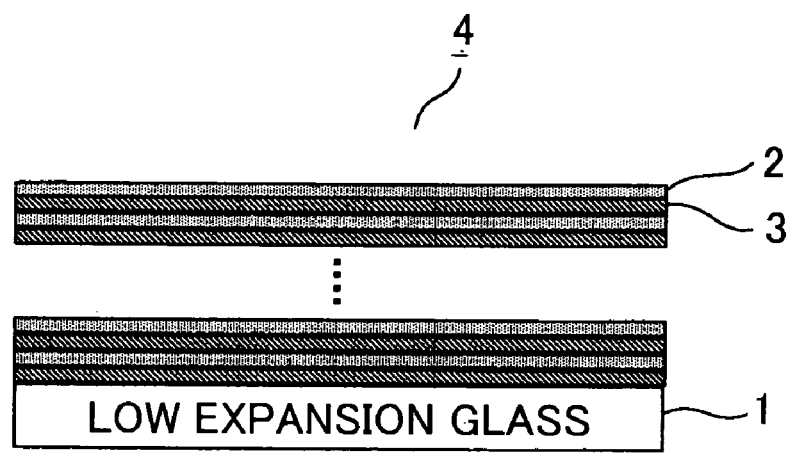
FIG. 2 is a cross sectional side view showing an example of the outline structure of a reflector for exposure light according to the present invention.

Next, description will be made of a reflector for extreme ultraviolet light to be used by this exposure apparatus, i.e., a reflector for extreme ultraviolet light according to the present invention. The reflector for extreme ultraviolet light described herein is used as a reflection mirror constituting a mirror reflection surface of an optical system or a mask blank constituting a reflection surface of an exposure mask. More specifically, as shown in FIG. 2, the reflector has a multi-layer film structure made by repetitively stacking 40 layers each constituted of an Si layer 2 and an Mo layer 3 in the same order of Mo/Si/Mo/Si, . . . , Mo/Si from a low expansion glass 1 of, for example, $SiO_2$ (silicon dioxide) or the like toward the reflector surface (front surface). The reflector 4 having the multi-layer film structure of this type may be formed by ion beam sputtering. More specifically, the Si layer 2 and Mo layer 3 are formed at predetermined film forming speeds by using, for example, an ion beam sputtering system.

Figure 3:
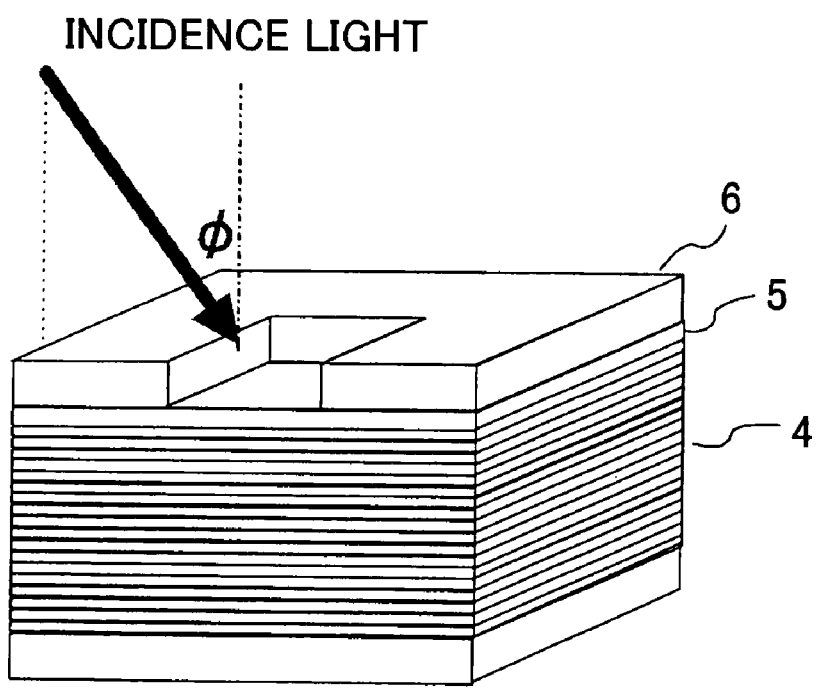
FIG. 3 is a perspective view showing an example of the outline structure of a mask according to the present invention.

In order to configure a reflection type exposure mask by using the reflector 4, as shown in FIG. 3 an absorption film 6 made of extreme ultraviolet light absorbing material such as TaN (tantalum nitride) is formed on the reflector 4, with a buffer film 5 made of Ru (ruthenium) or the like being interposed therebetween. Namely, a light reflection surface side of the reflector 4 is covered with the absorption film 6 having a predetermined pattern so that incidence light can be selectively reflected in correspondence with a circuit pattern, resist pattern or the like to be formed. If a reflection mirror is to be configured, the light reflection surface of the reflector is used as it is to reflect incidence light. For example, as the optical conditions, a center wavelength (exposure wavelength) of extreme ultraviolet light as incidence light is set to 13.5 nm, and as the exposure conditions, NA=0.25 and σ=0.70.

Figure 1:
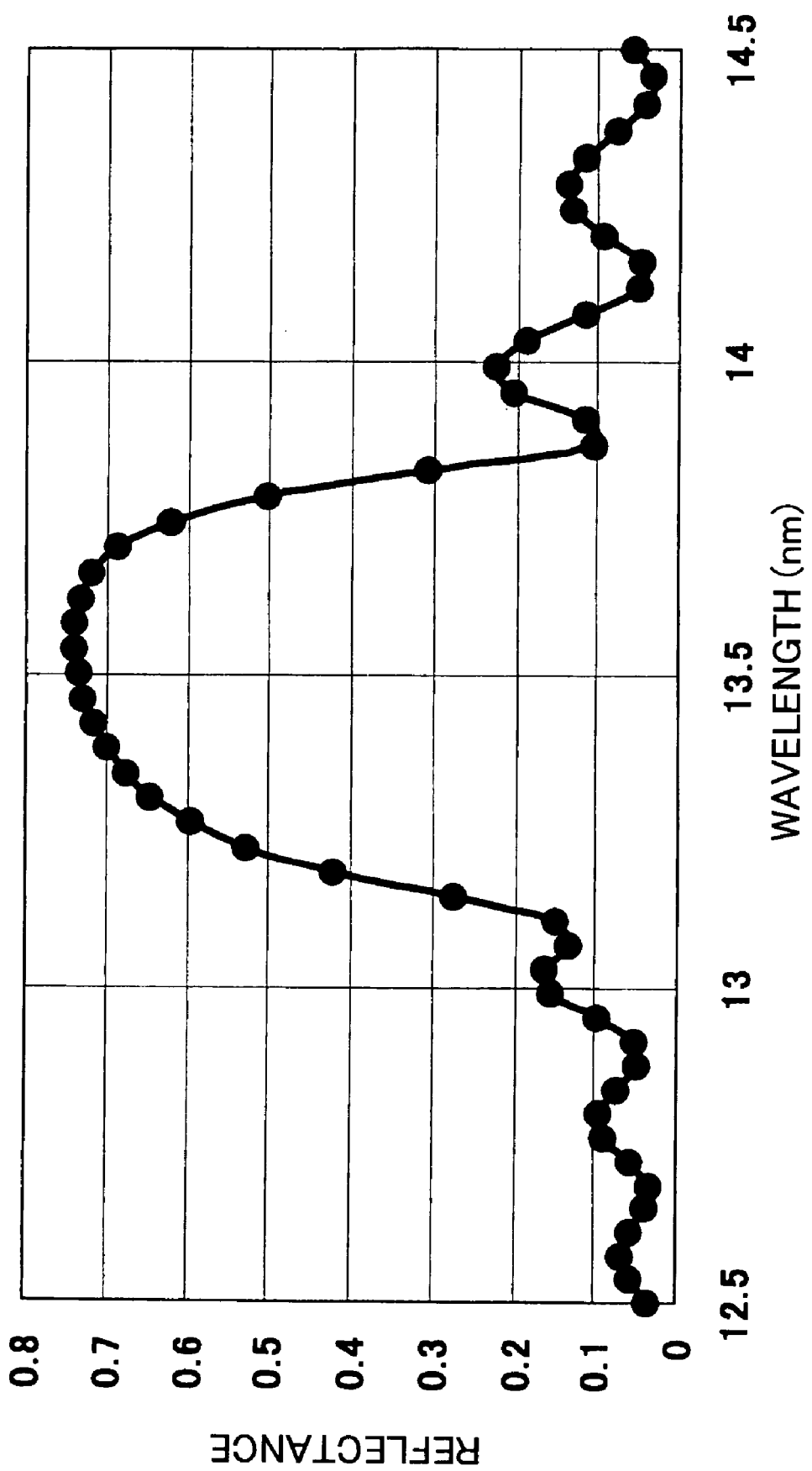
FIG. 1 is an illustrative diagram showing an example of reflectances when a single reflector is used for extreme ultraviolet light, and more specifically a diagram showing reflectances by one reflector surface of a multi-layer film structure made by stacking 40 layers of Si 4.184 nm/Mo 2.789 nm at a periodical length 6.973 nm of a film thickness.
Figure 4:
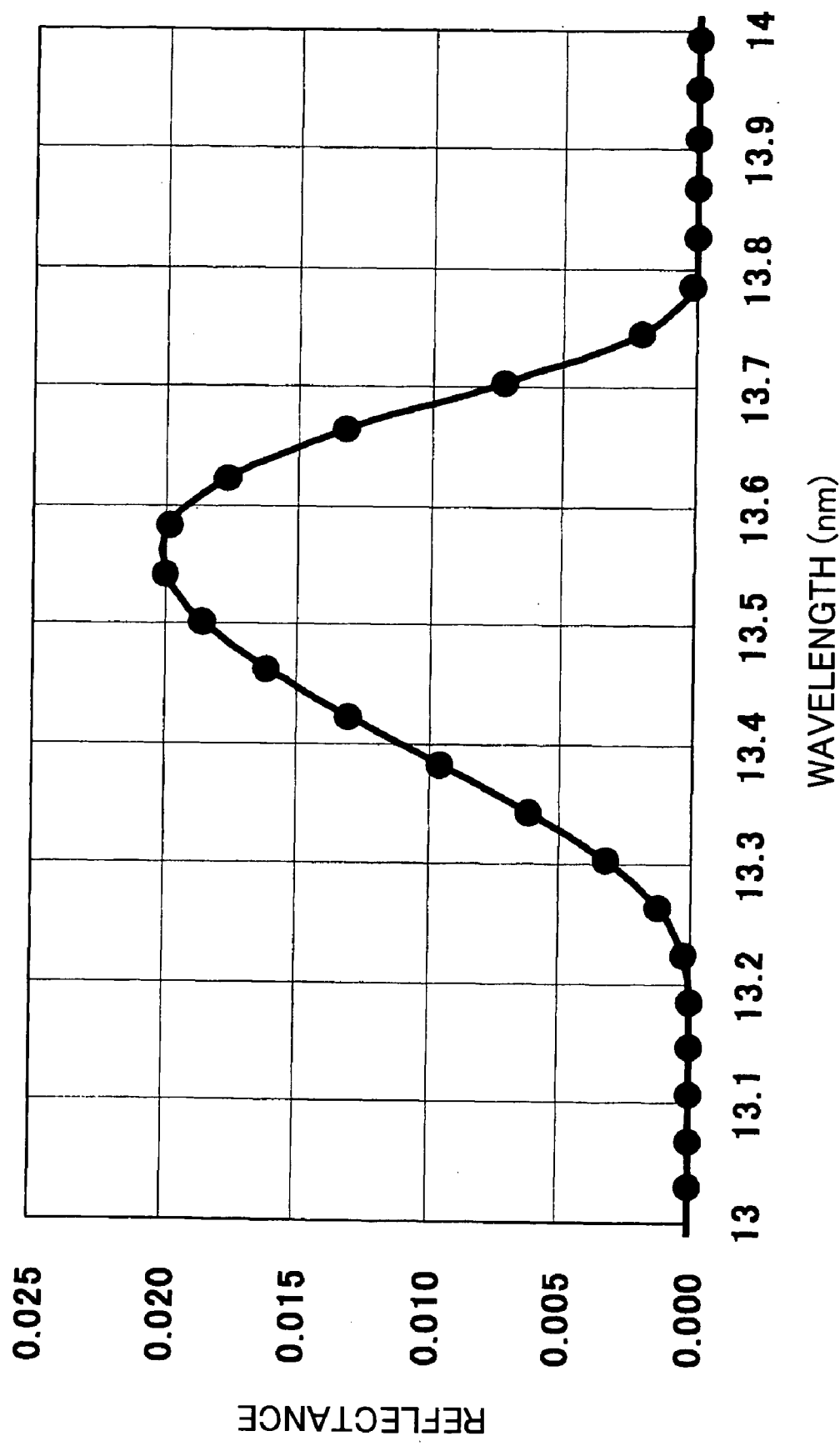
FIG. 4 is an illustrative diagram showing an example of reflectances when extreme ultraviolet light propagates via a plurality of reflectors, and more specifically a diagram showing reflectances by thirteen reflector surfaces each constituted of a multi-layer film structure made by stacking 40 layers of Si 4.184 nm/Mo 2.789 nm at a periodical length 6.973 nm of a film thickness.

As already described, since the reflector having the multi-layer film structure of this type has an Si reflectance of 0.9993–0.00182645i, an Mo reflectance of 0.9211–0.00643543i and an extreme ultraviolet light wavelength λ of 13.5 nm, generally a ratio Γ of a thickness of the Mo layer to a total thickness of the Si layer and Mo layer is set to 0.4, a total thickness of the Si layer and Mo layer is set to $(\lambda/2)/(0.9993 \times 0.6 + 0.9211 \times 0.4) = 6.973$ nm, a thickness of the Si layer is set to 6.9730×0.6=4.184 nm and a thickness of the Mo layer is set to 6.9730×0.4=2.789 nm. However, with the reflector having the multi-layer film structure constructed as above, as shown in FIG. 1, although the center of FWHM of the reflectance by a single reflector is coincident with the center wavelength of exposure light, the peak wavelength is shifted from the center wavelength of exposure light. Therefore, as shown in FIG. 4, the wavelength dependency of the reflectance R via the propagation route of thirteen reflection surfaces in total may shift from the center wavelength of exposure light because the center of FWHM is not always coincident with the center wavelength of exposure light.

The reflector 4 having the multi-layer film structure described in this preferred embodiment is designed to have a periodical length of a film thickness of a repetitive stack unit of the Si layer 2 and Mo layer 3, different from a conventional design, in order to make the reflectance become coincident with the center wavelength of exposure light so that sufficient energy reaching resist can be retained even if the propagation route via thirteen reflection surfaces in total is used. Namely, with the reflector 4 described in the preferred embodiment, the periodical length of the repetitive stack unit of the multi-layer film structure is set so that the center of FWHM of the reflectance via the thirteen reflection surfaces in total becomes coincident with the center wavelength of extreme ultraviolet light.

More specifically, a shift is considered between the peak wavelength of the reflectance by a single reflector and the center wavelength of exposure light. A correction corresponding to this shift amount is added to the value of the wavelength λ of extreme ultraviolet light and the total thickness of the Si layer 2 and Mo layer 3 is identified by an equation of (λ/2)/(0.9997×0.6+0.9221×0.4) while the value of the film thickness ratio Γ is maintained at 0.4. In this manner, the reflector 4 described in this embodiment has a structure such that the total thickness of the Si layer 2 and Mo layer 3, i.e., a periodical length of the repetitive stack unit, is 6.95 nm. In this case, since Γ=0.4, a film thickness of one Si layer 2 is 4.17 nm and a film thickness of one Mo layer 3 is 2.78 nm.

Figure 5:
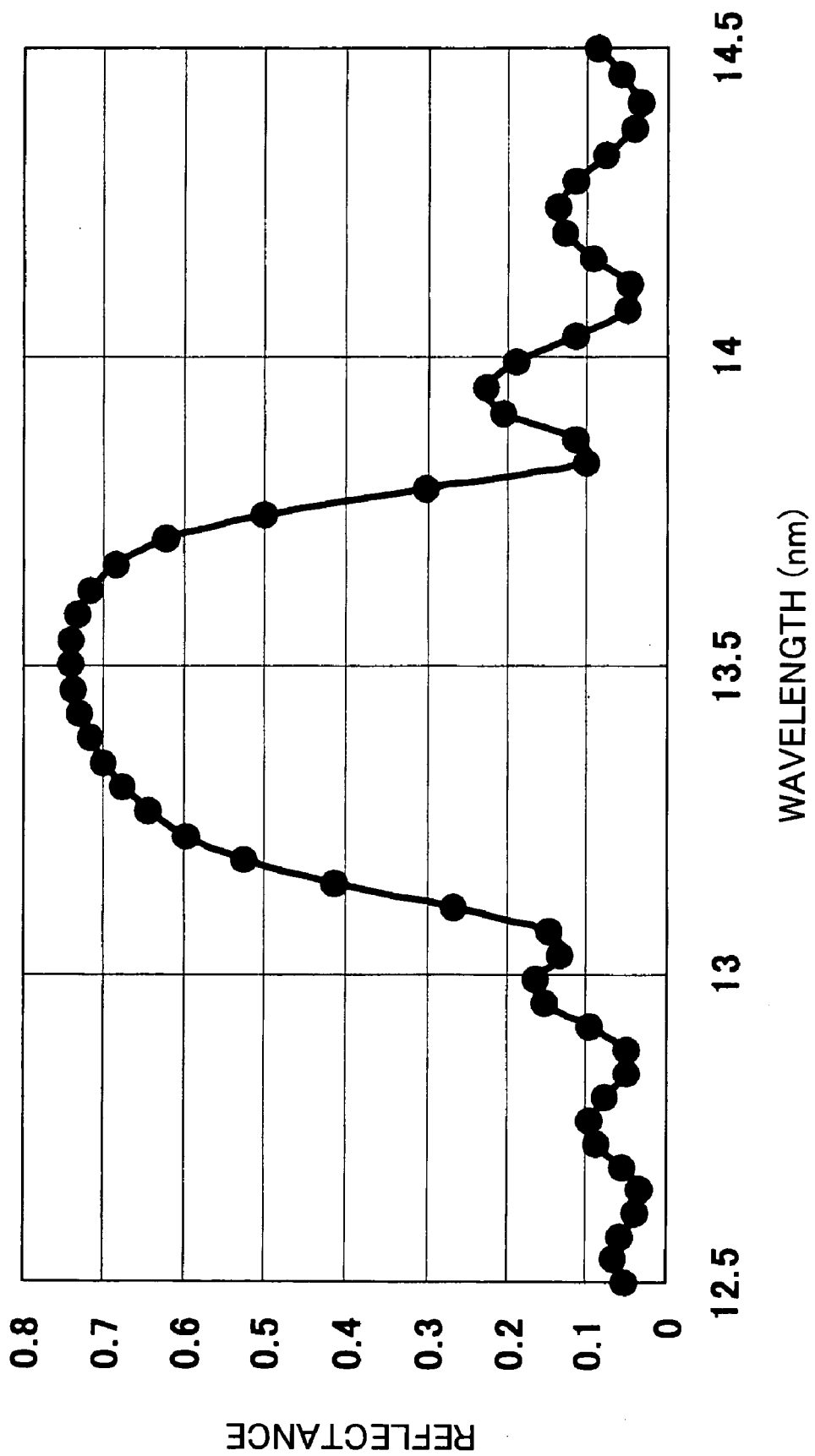
FIG. 5 is an illustrative diagram showing an example of reflectances when extreme ultraviolet light propagates via a single reflector according to the present invention, and more specifically a diagram showing reflectances by a single reflector surface constituted of a multi-layer film structure made by stacking 40 layers of Si 4.17 nm/Mo 2.78 nm at a periodical length 6.95 nm of a film thickness.
Figure 6:
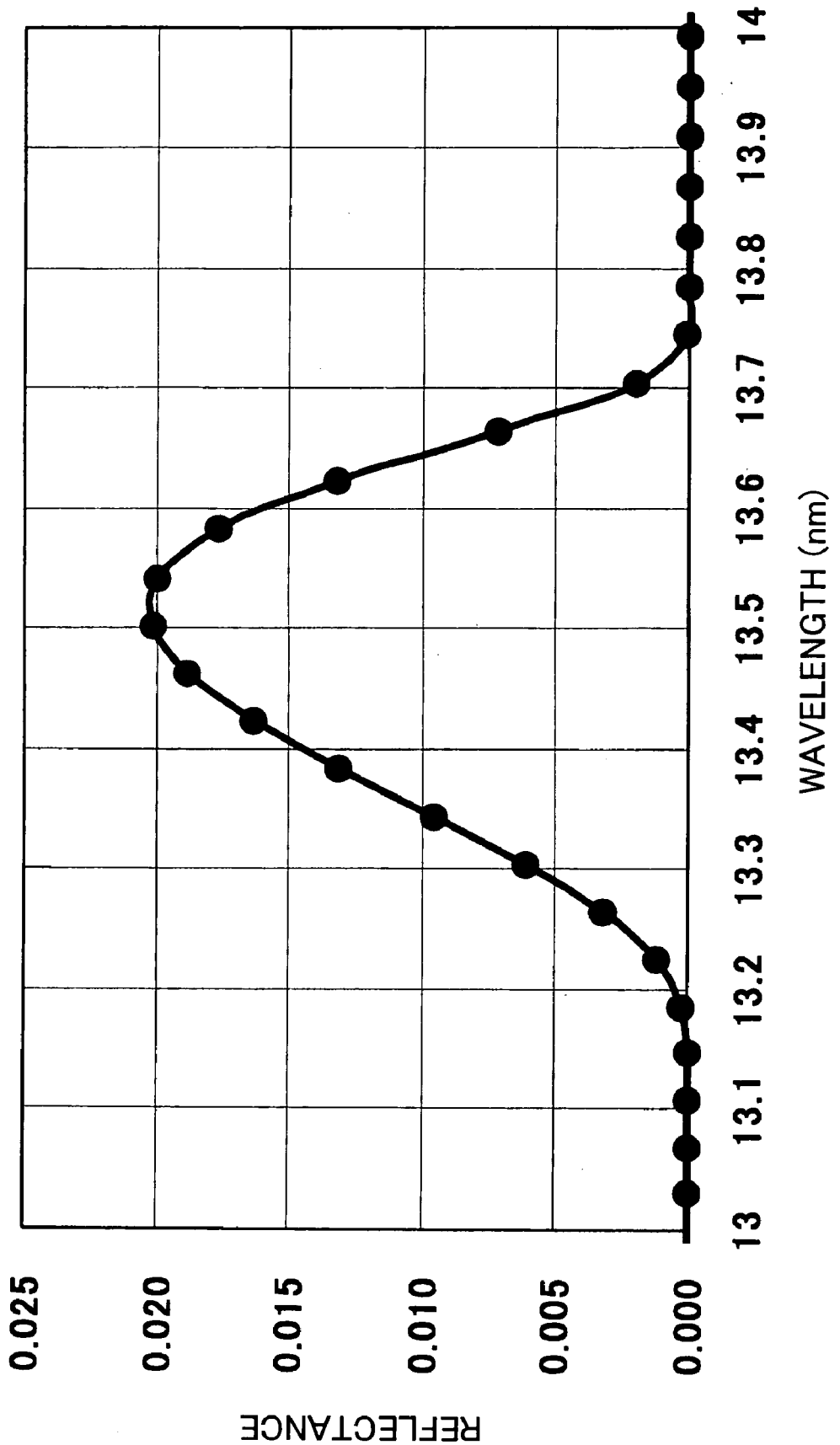
FIG. 6 is an illustrative diagram showing an example of reflectances when extreme ultraviolet light propagates via a plurality of reflectors according to the present invention, and more specifically a diagram showing reflectances by thirteen reflector surfaces each constituted of a multi-layer film structure made by stacking 40 layers of Si 4.17 nm/Mo 2.78 nm at a periodical length 6.95 nm of a film thickness.

The reflector 4 structured as above has a reflectance spectrum by a single reflector wherein as shown in FIG. 5 the center of FWHM is not coincident with the center wavelength of exposure light. However, for the reflectance R via thirteen reflection surfaces in total, as shown in FIG. 6 the center of FWHM is coincident with the center wavelength of exposure light. This may be ascribed to the fact that since the periodical length of a film thickness of the repetitive stack unit of the multi-layer film structure, i.e., the optical periodical length, is different from a conventional length, the wavelengths strengthening through interference by the multi-layer film structure are also different so that the peak wavelength of the reflectance shifts.

Figure 7:
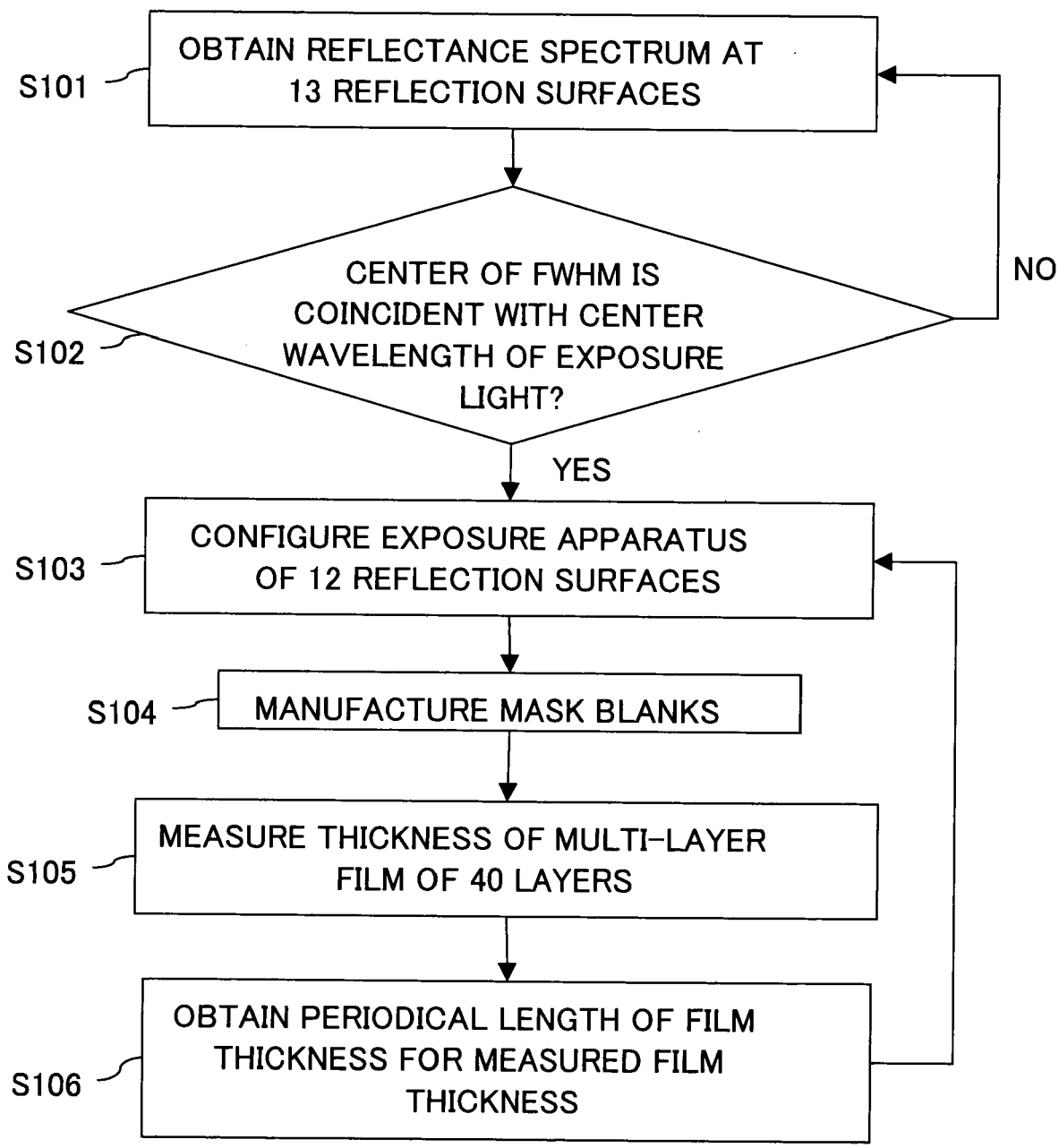
FIG. 7 is a flow chart illustrating an example of a manufacture procedure for a reflector to be used with extreme ultraviolet light according to the present invention.

Description will be made of a manufacturing procedure for the reflector 4 having this structure. FIG. 7 is a flow chart illustrating an example of a reflector manufacturing procedure. As illustrated in this drawing, when the reflector 4 is manufactured, first a reflectance spectrum is obtained at the route corresponding to the number of reflectors 4 mounted on the exposure apparatus, particularly, thirteen reflection surfaces in total (Step 101, hereinafter Step is abbreviated to "S"). The reflectance spectrum may be actually measured by forming a sample of the reflector or may be obtained by utilizing simulation techniques. After the reflectance spectrum is obtained, it is judged whether the center of FWHM of the reflectance spectrum is coincident with the center wavelength of exposure light of extreme ultraviolet light (S102). If this judgement result indicates that both are not coincident, the periodical length of a film thickness of the Si layer 2 and Mo layer 3 of the multi-layer film structure is changed so as to make both become coincident (setting is performed again), and thereafter the reflectance spectrum is again obtained at the route of thirteen reflection surfaces in total (S101). These processes are repeated until both become coincident. It can be considered that the film thicknesses of the Si layer 2 and Mo layer 3 of the multi-layer film structure are set to have desired values by properly adjusting the film forming speeds, for example, of sputtering.

If the exposure apparatus, particularly an optical system formed by reflection mirrors, is structured by using the reflectors 4 formed in the above-described manner (e.g., reflector having a periodical length of a film thickness of 6.95 nm and Γ of 0.4), the reflectance R becomes coincident with the center wavelength of exposure light even as the route of the extreme ultraviolet light propagates via thirteen reflection surfaces in total between the light source for extreme ultraviolet light and the resist on a wafer. It is therefore possible to suppress a large attenuation of the intensity of extreme ultraviolet light and retain sufficient energy for resist exposure.

Of the reflector 4 used by the exposure apparatus, a mask blank constituting an exposure mask among others is frequently changed with a circuit pattern to be transferred. Therefore, an individual difference is inevitable, namely, a film thickness variation of multi-layer film structures of mask blanks is inevitable. The film thickness variation of multi-layer film structures is mainly classified into two variations, variations of respective thicknesses $d_{Si}$ of Si layers 2 and respective thicknesses $d_{Mo}$ of Mo layers 3 and a variation of total film thicknesses $d_{total}$ after 40 layers are stacked. This relation is represented by the following equation (2):

$$d_{total} = \sum_{j}^{40} djSi + \sum_{j}^{40} djMo \qquad (2)$$

wherein the variations of respective thicknesses $d_{Si}$ of Si layers 2 and respective thicknesses $d_{Mo}$ of Mo layers 3 do not influence greatly the intensity reduction by reflection of extreme ultraviolet light if the variation of total film thicknesses $d_{total}$ is restricted in a desired range. This can be confirmed by calculating the reflectance $R_{total}$, for example, via the route of thirteen reflection surfaces of the exposure apparatus including twelve reflection mirrors structured to have a periodical length of a film thickness of 6.95 nm and Γ=0.4 and one mask blank having a film thickness variation, by using the following equation (3) and a reflectance $R_{12}$ via twelve reflection mirrors and a reflectance $R_{mask}$ of the mask blank having a film thickness variation.

$$R_{total} = R_{12} \times R_{mask} \qquad (3)$$

More specifically, the mask blanks having variations of $d_{Si}$ and $d_{Mo}$ are used, and the energies reaching resist on a wafer at standard deviations 3σ=0.5 nm and 3σ=1.0 nm are compared with the energy at 3σ=0.0 nm. More specifically, the energy $E_{(3\sigma=0.5)} = \int R_{total} \, d\lambda$ at 3σ=0.5 nm and the energy $E_{(3\sigma=1.0)} = \int R_{total} \, d\lambda$ at 3σ=1.0 nm are obtained, and these energies are compared with the energy $E_{(3\sigma=0)} = \int R_{total} \, d\lambda$ at 3σ=0.0 nm. These comparisons are performed by using the following equations (4) and (5):

$$E_{relative} = E_{(3\sigma=0.5)}/E_{(3\sigma=0)} \quad (4)$$

$$E_{relative} = E_{(3\sigma=1.0)}/E_{(3\sigma=0)} \quad (5)$$

Figure 8:
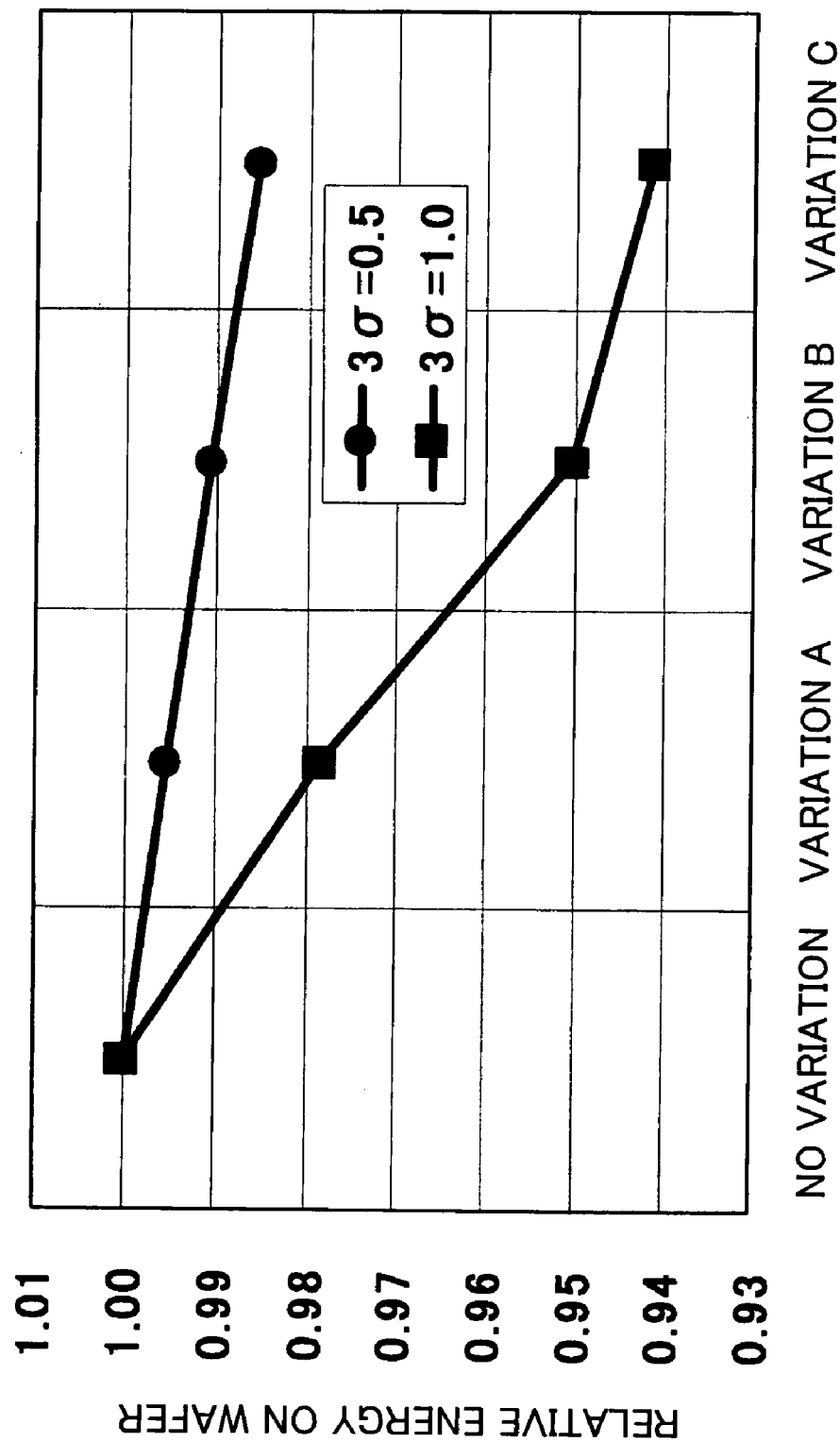
FIG. 8 is an illustrative diagram showing an example of the results of relative energies reaching wafers when there is a film thickness variation of respective layers constituting a multi-layer film structure.

The comparison results of reaching energies at three types of variations (variations A to C) obtained by using the equations (4) and (5) are shown in FIG. 8. In this case, if $E_{relative} \geq 0.95$ is used as the judgement criterion based on the rule of thumb, as apparent from the example shown in the drawing, the energy reaching degree does not pose any problem at 3σ=0.5 nm, and no problem occurs even at 3σ=1.0 nm for the two types of variations (variations A and B). With respect to these results, in the actual mask blank manufacture process, it is possible to control the variation width narrower than that at 3σ=0.5. If these results are considered synthetically, it can be said that these variations do not pose any problem even if there are variations of the film thickness $d_{Si}$ of Si layer 2 and the film thicknesses $d_{Mo}$ of Mo layers 3.

Figure 9:
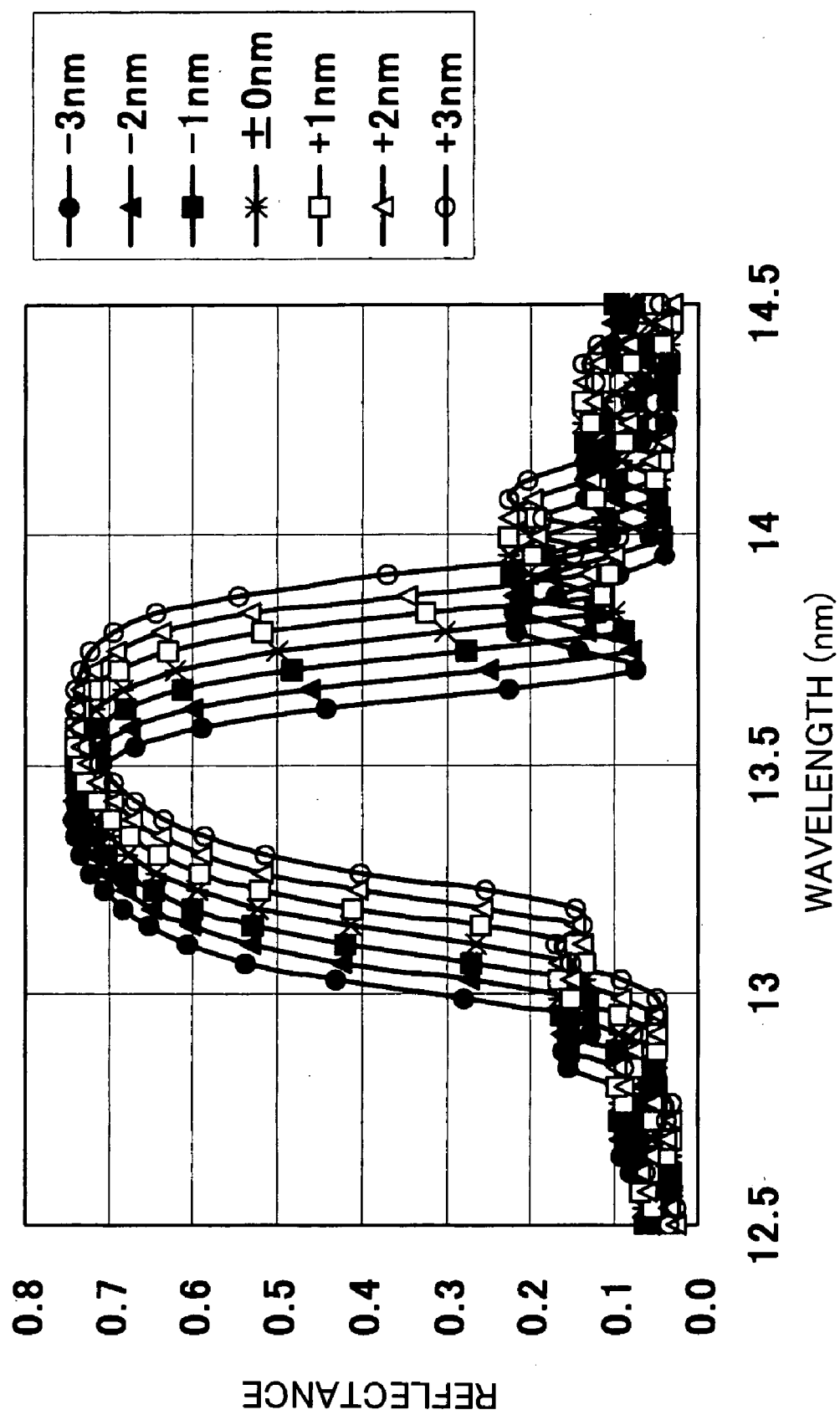
FIG. 9 is an illustrative diagram showing an example of reflectances by a single reflector when there is a variation of total film thicknesses of multi-layer film structures, and more specifically a diagram showing reflectances $R_{mask}$ of thinner and thicker cases of the total film thickness $d_{total}$=278 nm of a multi-layer film structure made by stacking 40 layers of Si 4.17 nm/Mo 2.78 nm at a periodical length 6.95 nm of a film thickness.

Unlike the variations of the film thicknesses $d_{Si}$ and $d_{Mo}$ of the layers, the variation of the total film thicknesses $d_{total}$ greatly influences the intensity reduction of extreme ultraviolet light by reflection. This can be ascribed to the fact that, for example, in the case of a multi-layer film structure having Γ=0.4, even if the center of FWHM of the reflectance spectrum is made coincident with the center wavelength of exposure light of extreme ultraviolet light as described previously, the center of FWHM shifts to the shorter wavelength side from the center wavelength of exposure light if the total film thicknesses $d_{total}$ of the multi-layer film structure have a variation and become thinner than a desired value, whereas the center of FWHM shifts to the longer wavelength side from the center wavelength of exposure light if the total film thickness becomes thicker than the desired value. FIG. 9 shows reflectances $R_{mask}$ at variations from −3 nm to +3 nm of the total film thicknesses $d_{total}$ of multi-layer film structures wherein, for example, Γ is 0.4, the film thickness of the Si layer 2 is 4.17 nm, the film thickness of the Mo layer 3 is 2.78 nm and the periodical length of the repetitive stack unit is 6.95 nm. It can be seen from the example shown in the drawing that the center of FWHM of the reflectance $R_{mask}$ shifts to the shorter or longer wavelength side of the center wavelength of exposure light in accordance with the variation of the total film thicknesses $d_{total}$.

Unlike the variations of the film thicknesses $d_{Si}$ and $d_{Mo}$ of the layers, the variation of the total film thicknesses $d_{total}$ must be restricted to be within a predetermined constant allowable range.

Figure 10:
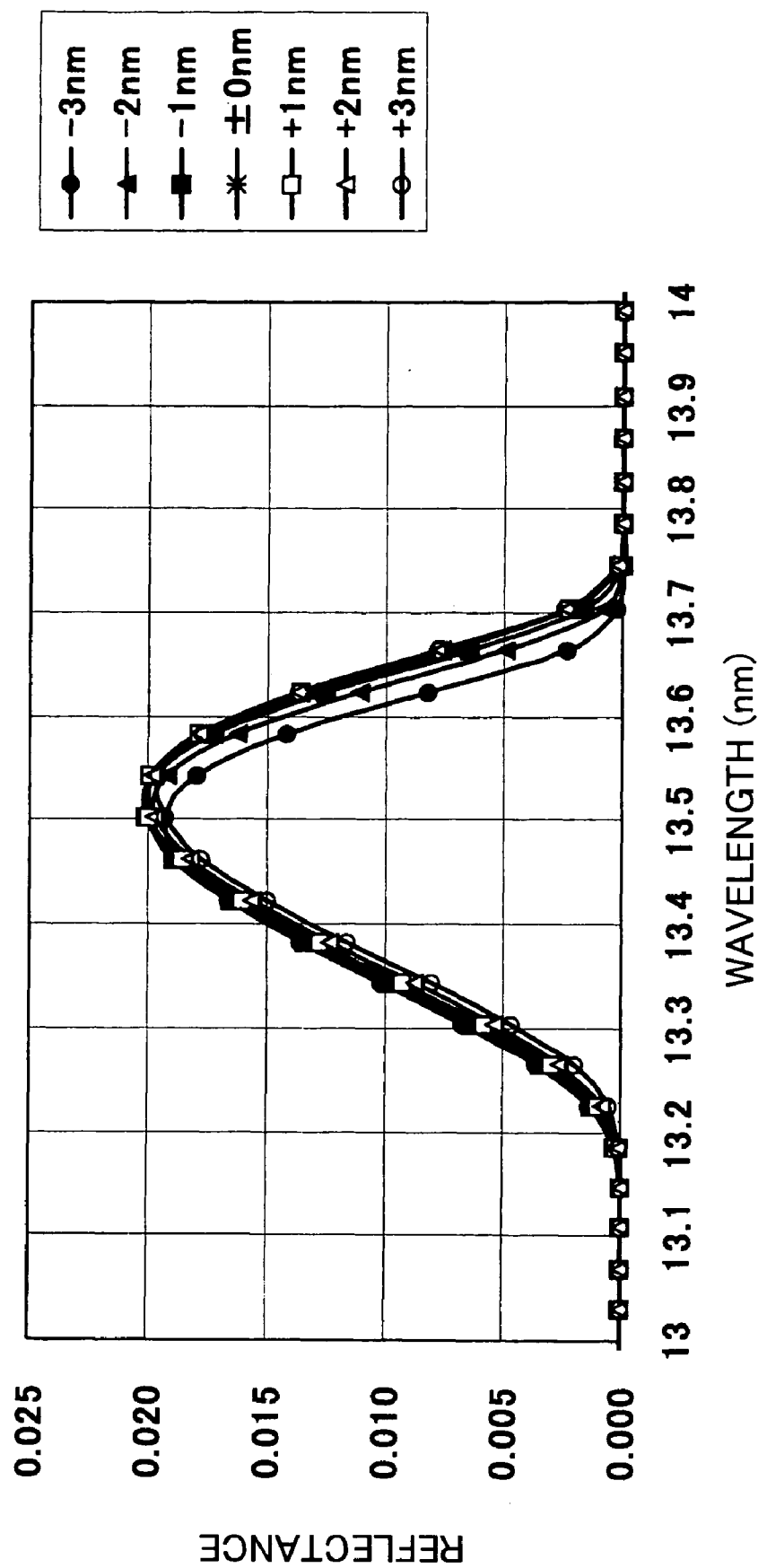
FIG. 10 is an illustrative diagram showing an example of reflectances by a plurality of reflectors when there is a variation of total film thicknesses of multi-layer film structures, and more specifically a diagram showing reflectances $R_{total}$ by twelve multi-layer film mirrors each having a total thickness $d_{total}$=278 nm and manufactured by stacking 40 layers of Si 4.17 nm/Mo 2.78 nm at a periodical length 6.95 nm of a film thickness and via one mask blank having the multi-layer film structure and a variation of total film thicknesses $d_{total}$.

A variation width of the total film thickness $d_{total}$ can be obtained as in the following for multi-layer film structures having, for example, Γ of 0.4. First, based upon the results shown in FIG. 9, the reflectances $R_{total}$ via thirteen surfaces in total relative to the variations of the total film thicknesses $d_{total}$ are obtained. The results are shown in FIG. 10. The energies reaching resist on a wafer are obtained from the results shown in FIG. 10 and compared each other. More specifically, for example, the total film thickness $d_{total}$ is changed from −3 nm to +3 nm and the reaching energies $E(\Delta d_{total}=-3)=\int R_{total} \, d\lambda$, $E(\Delta d_{total}=-2)=\int R_{total} \, d\lambda$, $E(\Delta d_{total}=-1)=\int R_{total} \, d\lambda$, $E(\Delta d_{total}=+1)=\int R_{total} \, d\lambda$, $E(\Delta d_{total}=+2)=\int R_{total} \, d\lambda$, $E(\Delta d_{total}=+3)=\int R_{total} \, d\lambda$ are obtained and compared with the reaching energy $E(\Delta d_{total}=0)=\int R_{total} \, d\lambda$ with no variation.

Figure 11:
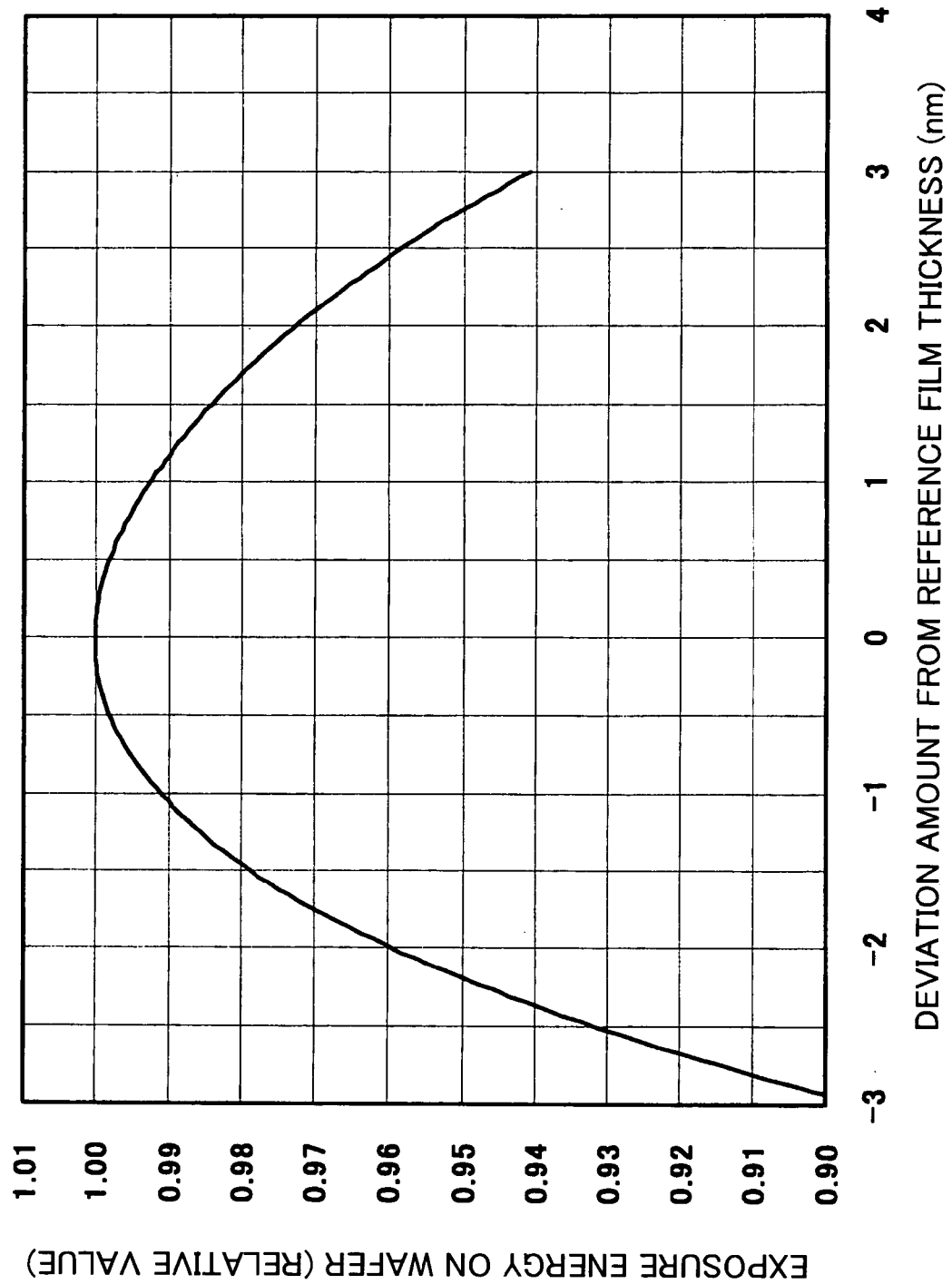
FIG. 11 is an illustrative diagram showing an example of relative energies reaching wafers when there is a variation of total thicknesses of multi-layer film structures, and more specifically a diagram showing relative energies $E_{relative}$ via the propagation route of twelve multi-layer film mirrors each having a total thickness $d_{total}$=278 nm and manufactured by stacking 40 layers of Si 4.17 nm/Mo 2.78 nm at a periodical length 6.95 nm of a film thickness and one mask blank having the multi-layer film structure and a variation of the total film thicknesses $d_{total}$.

Namely, the relative energies reaching the wafer at the variations of the $d_{total}$ are obtained, including $E_{relative}=E(\Delta d_{total}=-3)/E(\Delta d_{total}=0)$, $E_{relative}=E(\Delta d_{total}=-2)/E(\Delta d_{total}=0)$, $E_{relative}=E(\Delta d_{total}=-1)/E(\Delta d_{total}=0)$, $E_{relative}=E(\Delta d_{total}=0)/E(\Delta d_{total}=0)$, $E_{relative}=E(\Delta d_{total}=+1)/E(\Delta d_{total}=0)$, $E_{relative}=E(\Delta d_{total}=+2)/E(\Delta d_{total}=0)$, and $E(\Delta d_{total}=+3)/E(\Delta d_{total}=0)$. The comparison results of the energies $E_{relative}$ obtained in this manner are shown in FIG. 11.

The allowable range of the variation of $d_{total}$ can be obtained from the comparison results of the energies $E_{relative}$ relative to $\Delta d_{total}$. Namely, if $E_{relative} \geq 0.95$ based on the rule of thumb is used as the judgement criterion, it can be seen also from the results shown in FIG. 11 that the allowable variation of $d_{total}$ is in the range from −2.195 nm to +2.755 nm and in the range width of 4.95 nm. In other words, for multi-layer film structures having Γ of 0.4, a variation of 1.78% is allowable for the reference value $d_{total}=278$ nm.

However, if the productivity of, for example, a mask blank, is considered, it is needless to say that the allowable variation of $d_{total}$ is desired to have a broad width. In this context, multi-layer film structures are not configured to make the variation of the total film thicknesses $d_{total}$ fall in the allowable range while Γ is fixed to a constant value, but the allowable range of the variation of $d_{total}$ can be broadened by selecting an optimum Γ value together with the above-described periodical length of the film thickness of the multi-layer film structure.

Figure 12:
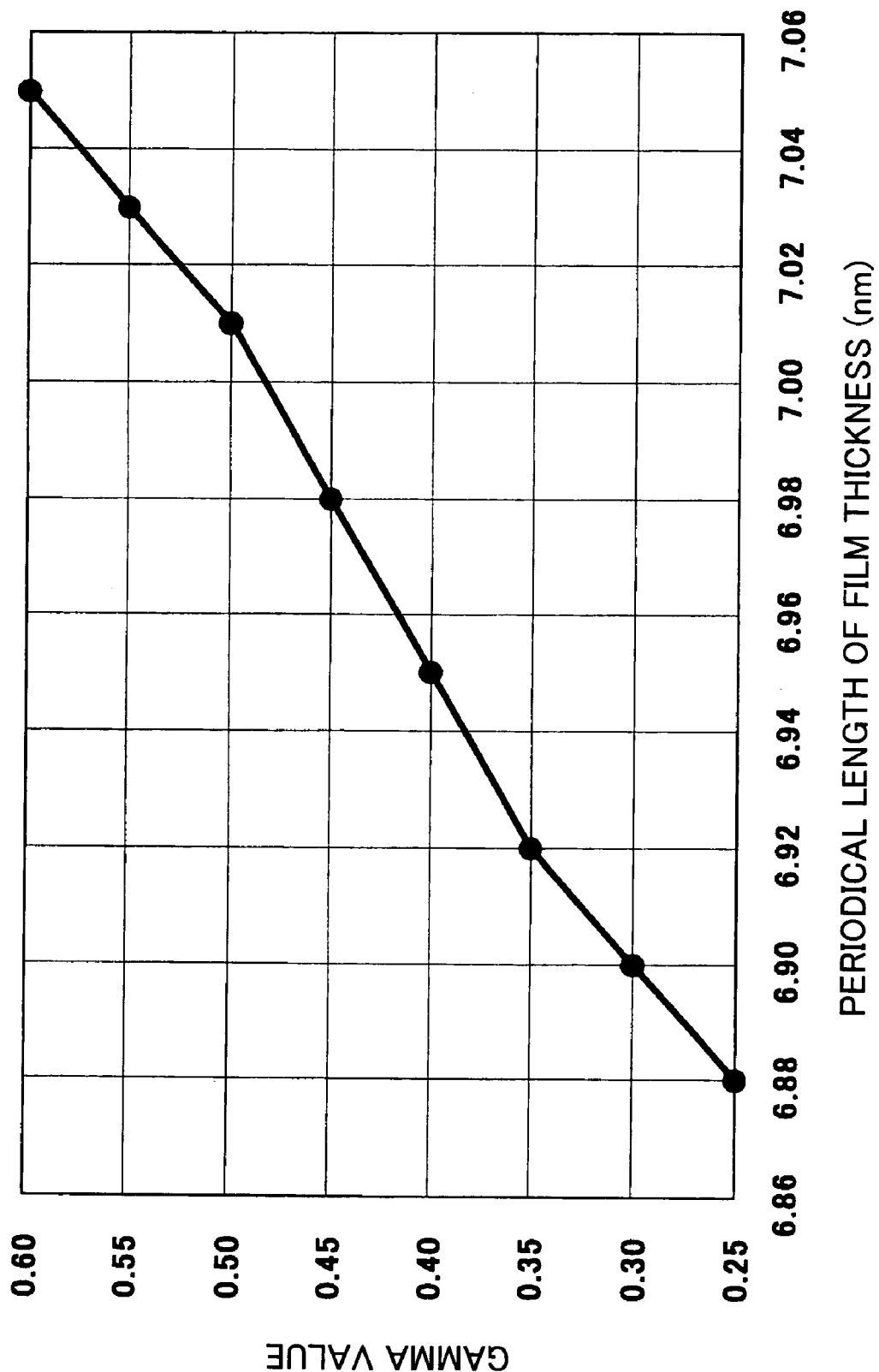
FIG. 12 is an illustrative diagram showing an example of the relation between a periodical length of a film thickness and an optimum Γ value of a multi-layer film structure.

Detailed description will be made on selecting an optimum Γ value. For example, the relation between the periodical length of the film thickness and an optimum Γ of a multi-layer film structure is shown in FIG. 12. More specifically, if the periodical length of a film thickness is 6.88 nm, Γ=0.25 (in this case, the total film thickness $d_{total}=275.2$ nm, the film thickness of one Si layer=5.1600 nm and the film thickness of one Mo layer=1.7200 nm); if the periodical length of a film thickness is 6.90 nm, Γ=0.30 (in this case, the total film thickness $d_{total}=276.0$ nm, the film thickness of one Si layer=4.8300 and the film thickness of one Mo layer=2.0700 nm), Γ=0.25 (in this case, the total film thickness $d_{total}=275.2$ nm, the film thickness of one Si layer=5.1600 nm and the film thickness of one Mo layer=1.7200 nm); if the periodical length of a film thickness is 6.90 nm, Γ=0.30 (in this case, the total film thickness $d_{total}=276.0$ nm, the film thickness of one Si layer=4.8300 nm and the film thickness of one Mo layer=2.0700 nm); if the periodical length of a film thickness is 6.92 nm, Γ=0.35 (in this case, the total film thickness $d_{total}=276.8$ nm, the film thickness of one Si layer=4.4980 nm and the film thickness of one Mo layer=2.4220 nm); if the periodical length of a film thickness is 6.95 nm, Γ=0.40 (in this case, the total film thickness $d_{total}=278.0$ nm, the film thickness of one Si layer=4.1700 nm and the film thickness of one Mo layer=2.7800 nm); if the periodical length of a film thickness is 6.98 nm, Γ=0.45 (in this case, the total film thickness $d_{total}=279.2$ nm, the film thickness of one Si layer=3.8390 nm and the film thickness of one Mo layer=3.1410 nm); if the periodical length of a film thickness is 7.01 nm, Γ=0.50 (in this case, the total film thickness $d_{total}=280.4$ nm, the film thickness of one Si layer=3.5050 nm and the film thickness of one Mo layer=3.5050 nm); if the periodical length of a film thickness is 7.03 nm, Γ=0.55 (in this case, the total film thickness $d_{total}=281.2$ nm, the film thickness of one Si layer=3.1635 nm and the film thickness of one Mo layer=3.8665 nm); and if the periodical length of a film thickness is 7.05 nm, Γ=0.60 (in this case, the total film thickness $d_{total}$=282.0 nm, the film thickness of one Si layer=2.8200 nm and the film thickness of one Mo layer=4.2300 nm).

Figure 13:
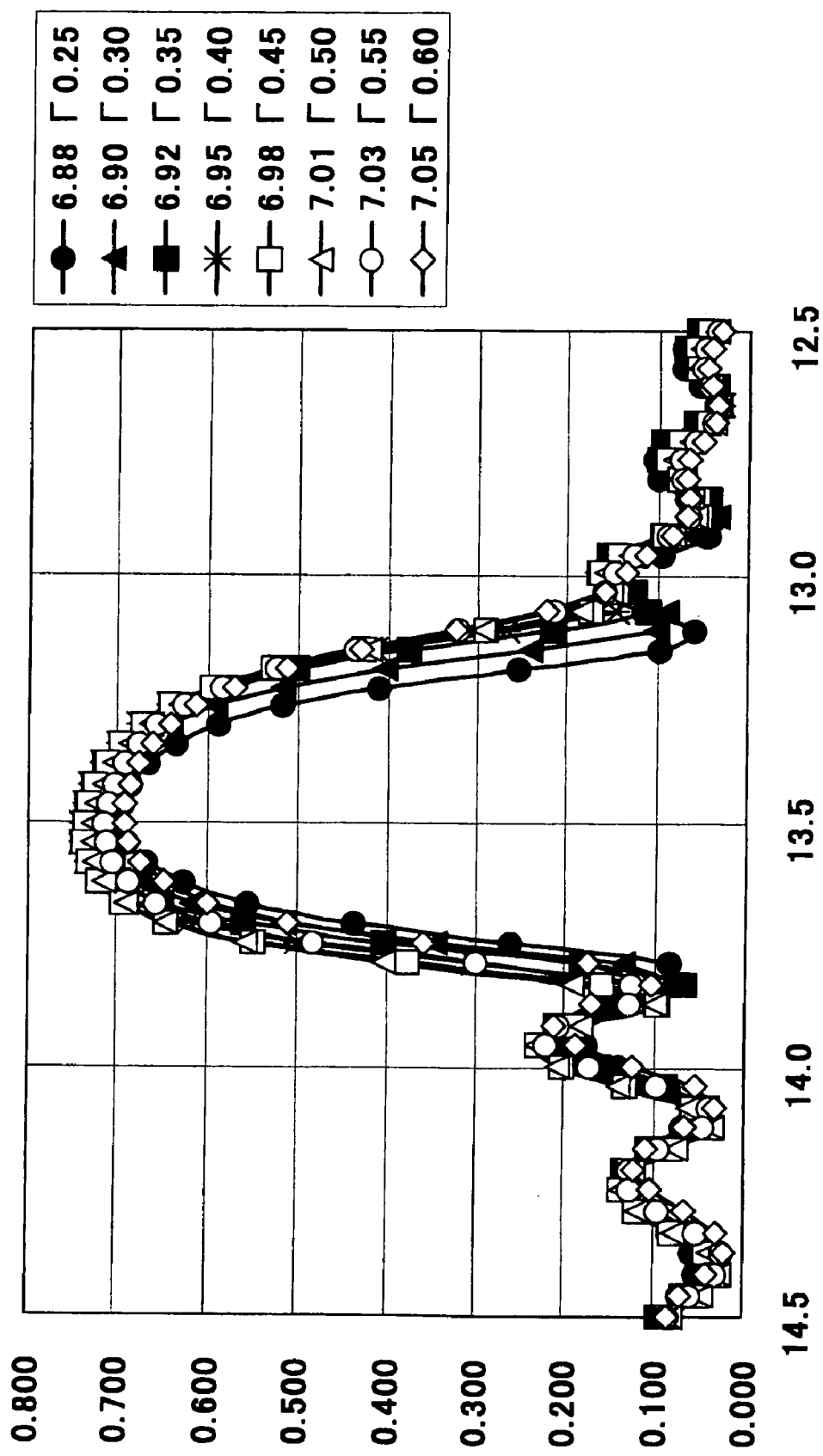
FIG. 13 is an illustrative diagram showing an example of reflectances by a single reflector for extreme ultraviolet light having an optimum Γ value according to the present invention, and more specifically a diagram showing reflectances $R_{mask}$ by one reflector surface of a multi-layer film structure having an optimum combination of a total film thickness $d_{total}$ and a Γ value and made by stacking 40 layers of Si 4.17 nm/Mo 2.78 nm at a periodical length 6.95 nm of a film thickness.

FIG. 13 shows reflectances by a single multi-layer film structure, i.e., by a single reflection surface when optimum Γ values are selected. It can be understood from the example shown in the drawing that even if the total thickness $d_{total}$ shifts, the wavelength giving the peak intensity will not be changed by optimizing a combination of the periodical length of a film thickness and Γ value.

Figure 14:
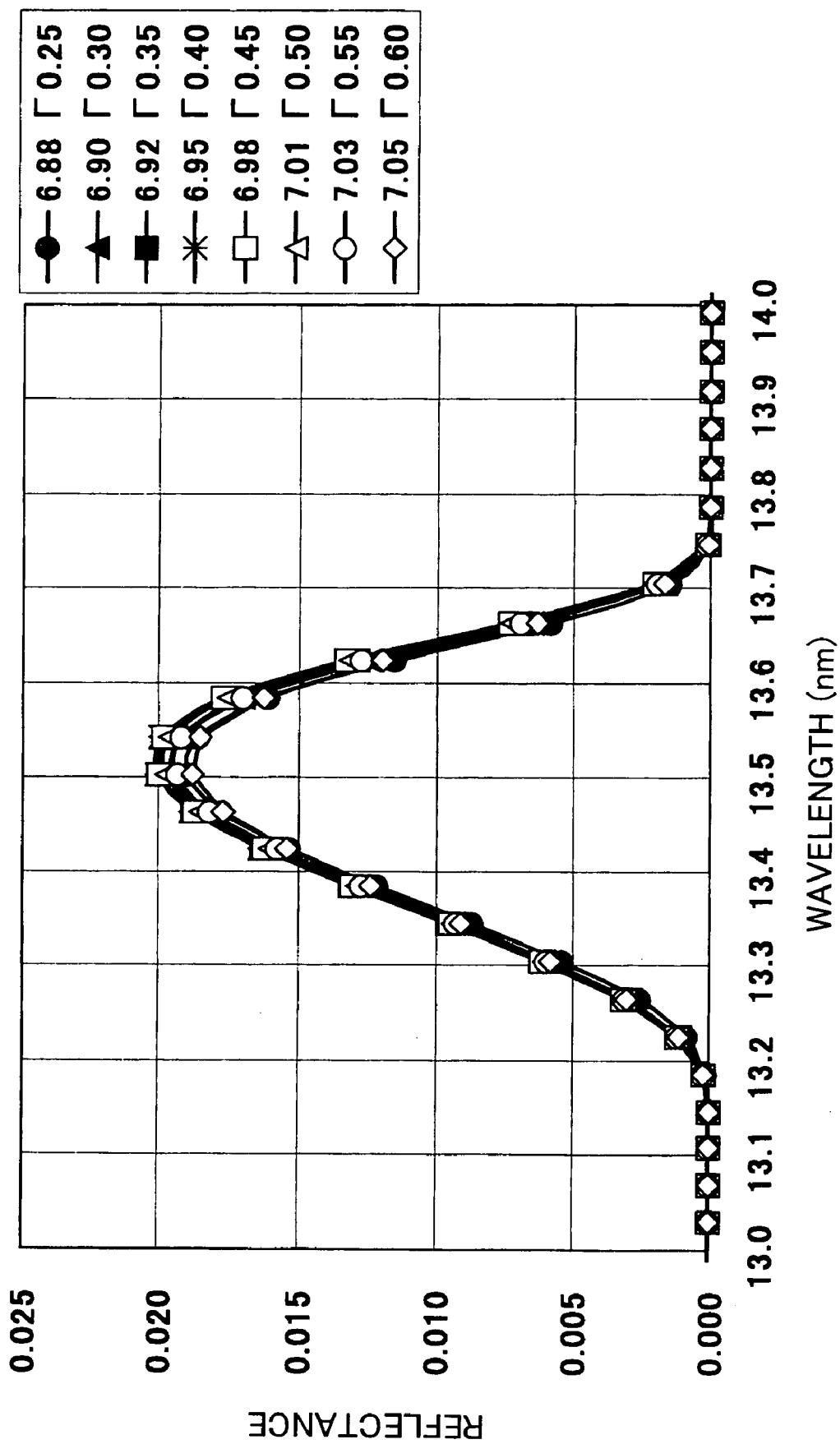
FIG. 14 is an illustrative diagram showing an example of reflectances by a plurality of reflectors for extreme ultraviolet light having an optimum Γ value according to the present invention, and more specifically a diagram showing reflectances $R_{total}$ by twelve multi-layer film mirrors each having a total thickness $d_{total}$=278 nm and manufactured by stacking 40 layers of Si 4.17 nm/Mo 2.78 nm at a periodical length 6.95 nm of a film thickness and by one mask blank having an optimum Γ value.

FIG. 14 shows reflectances $R_{total}$ via thirteen surfaces in total when optimum Γ values are selected. It can be understood from the example shown in the drawing that the half value center of the reflectance is always coincident with the center wavelength of exposure light at 13.5 nm.

The energies reaching resist on a wafer are obtained from the results shown in FIG. 14 and they are compared with each other. Specifically, the reaching energies when the optimum Γ values are selected are obtained, including E(Γ=0.25)=∫$R_{total}$ dλ, E(Γ=0.30)=∫$R_{total}$ dλ, E(Γ=0.35)=∫$R_{total}$ dλ, E(Γ=0.40)=∫$R_{total}$ dλ, E(Γ=0.45)=∫$R_{total}$ dλ, E(Γ=0.50)=∫$R_{total}$ dλ, E(Γ=0.55)=∫$R_{total}$ dλ, and E(Γ=0.60)=∫$R_{total}$ dλ, and compared with E(Γ=0.40)=∫$R_{total}$ dλ used as a reference.

Figure 15:
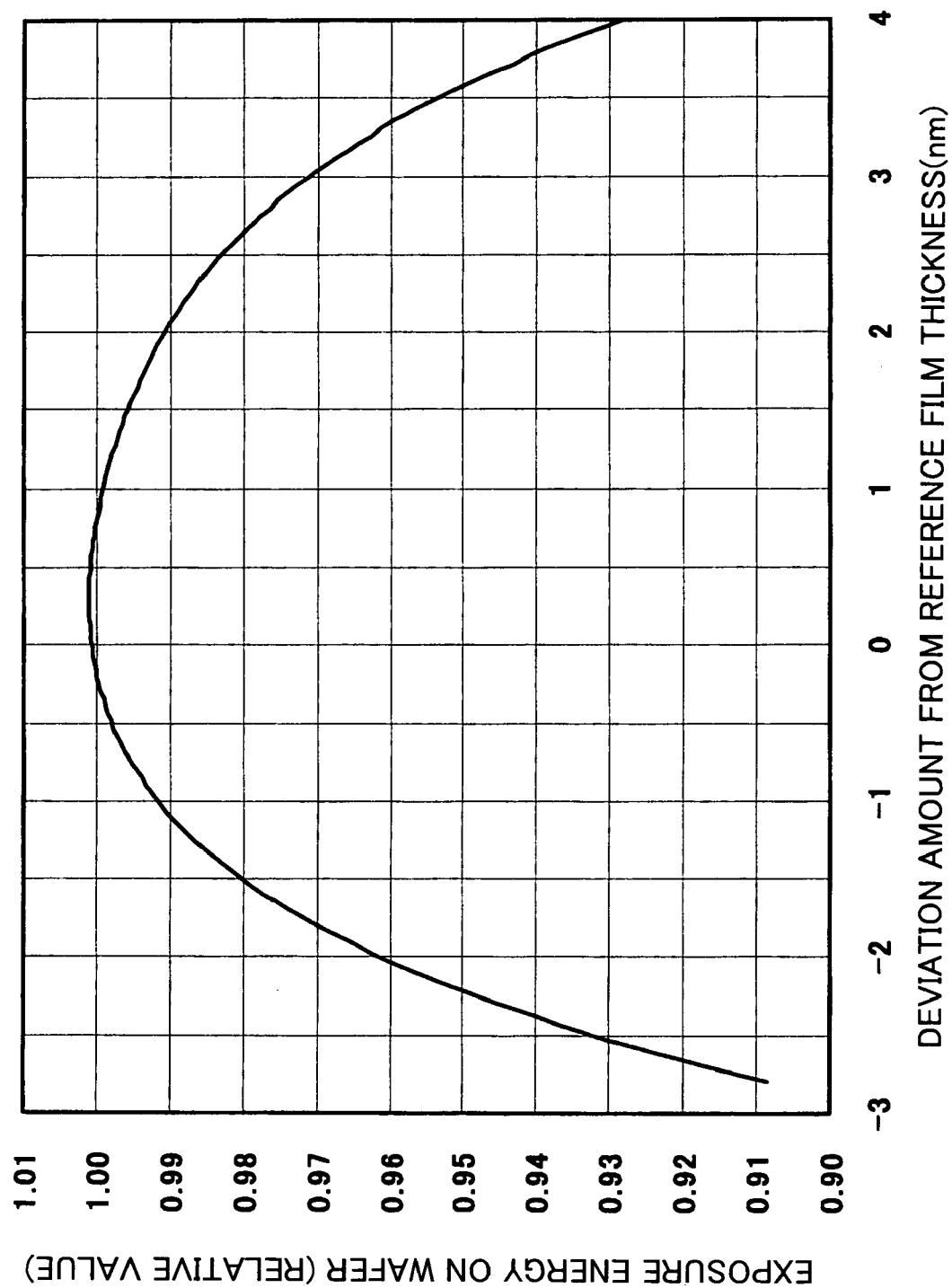
FIG. 15 is an illustrative diagram showing an example of relative energies reaching wafers via a plurality of reflectors for extreme ultraviolet light having an optimum Γ value according to the present invention, and more specifically a diagram showing relative energies $E_{relative}$ via the propagation route of twelve multi-layer film mirrors each having a total thickness $d_{total}$=278 nm and manufactured by stacking 40 layers of Si 4.17 nm/Mo 2.78 nm at a periodical length 6.95 nm of a film thickness and one mask blank having an optimum Γ value.

Namely, the relative energies reaching the wafer at the variations of $d_{total}$ are obtained, including $E_{relative}$=E(Γ=0.25)/E(Γ=0.40), E(Γ=0.30)/E(Γ=0.40), E(Γ=0.35)/E(Γ=0.40), E(Γ=0.40)/E(Γ=0.40), E(Γ=0.45)/E(Γ=0.40), E(Γ=0.50)/E(Γ=0.40), E(Γ=0.55)/E(Γ=0.40), and E(Γ=0.60)/E(Γ=0.40). The comparison results of $E_{relative}$ obtained in this manner are shown in FIG. 15.

The allowable range of the variation of $d_{total}$ can be obtained from the comparison results of $E_{relative}$ obtained in this manner. Namely, if $E_{relative}$≧0.95 based on the rule of thumb is used as the judgement criterion, it can be seen also from the results shown in FIG. 15 that the allowable variation of $d_{total}$ is in the range from −2.220 nm to +3.585 nm and in the range width of 5.805 nm. This means that a variation of 2.09% is allowable for the reference value $d_{total}$=278 nm.

Figure 16:
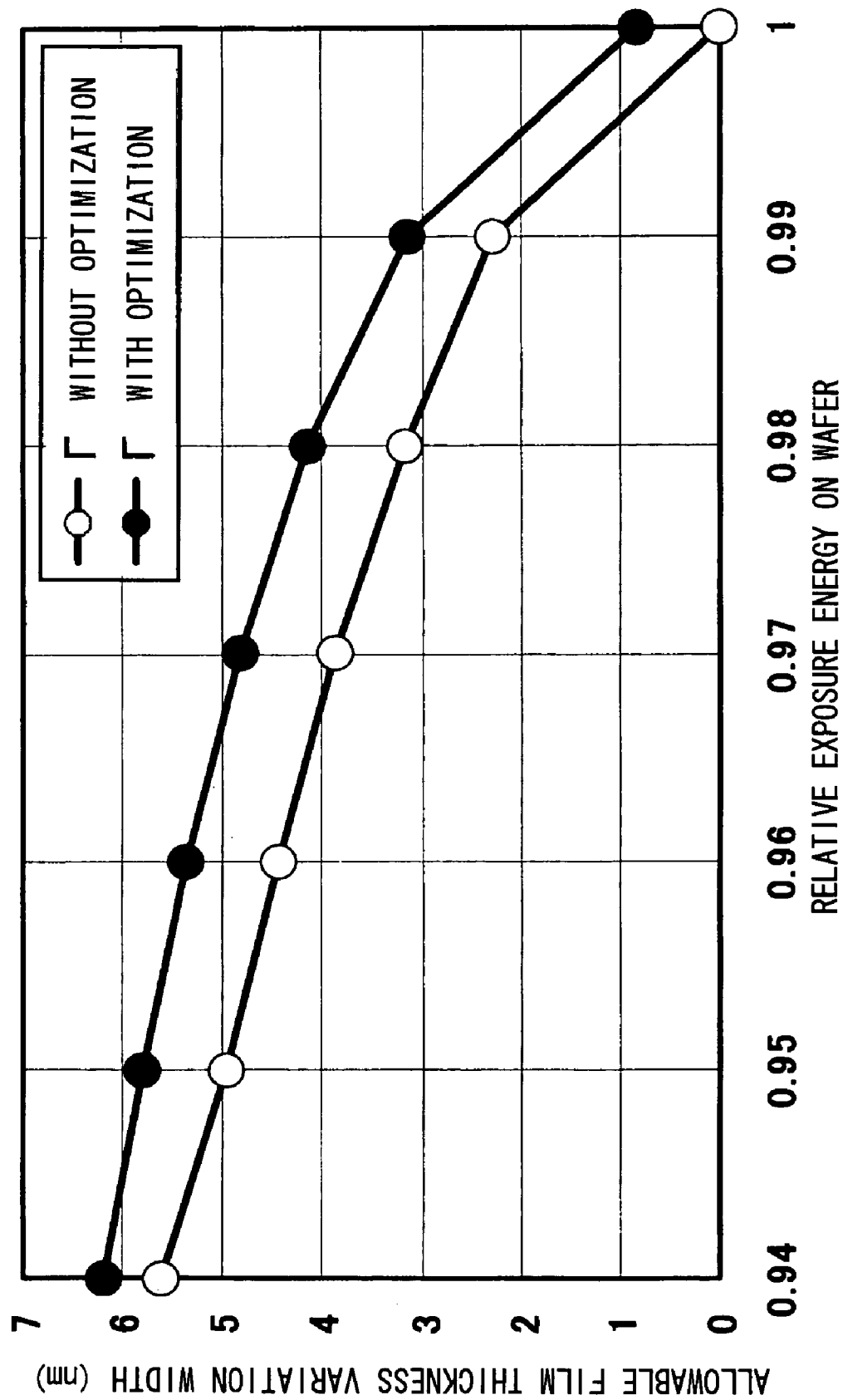
FIG. 16 is an illustrative diagram showing an example of the results obtained by plotting allowable variation values of a total film thickness as a function of a relative energy, for both the cases wherein a Γ value is optimized and not optimized.

Namely, if the multi-layer film structure is configured not by fixing Γ to a constant value but by selecting an optimum Γ value together with the periodical length of a film thickness, the allowable variation value of the total thickness $d_{total}$ of the multi-layer film structure increases. FIG. 16 shows the results obtained by plotting the allowable variation values of the total film thickness $d_{total}$ as a function of $E_{relative}$ in both cases when the Γ value is optimized and not optimized. It can be seen also from the example shown in the drawing that if the Γ value is optimized, the allowable variation value increases more than if the Γ value is not optimized, and that in the same variation range, a lager energy can be obtained than if the Γ value is not optimized.

It can be considered from this that of the reflectors 4 used by the exposure apparatus, the mask blank constituting the exposure mask among others is manufactured by selecting the optimum Γ value together with the periodical length of a film thickness. Namely, in the mask blank manufacture process, if $d_{total}$ is shifted from the $d_{total}$ reference value of 278 nm at Γ=0.40, the film forming conditions are selected from FIG. 12 so as to obtain an optimum relation between the Γ value and $d_{total}$.

More specifically, as shown in FIG. 7, after the exposure apparatus is configured having twelve reflection surfaces of the reflection mirrors having the periodical length of a film thickness set in the manner already described (S103), a mask blank used for the exposure apparatus is manufactured (S104). Before this manufacture, first the total film thickness $d_{total}$ of the multi-layer film structure is obtained (S105). The total film thickness $d_{total}$ may be actually measured by forming a sample of the mask blank or may be obtained by utilizing simulation techniques. It is assumed that the multi-layer film structure has Γ of 0.40.

After the total film thickness $d_{total}$ is obtained, the periodical length of the film thickness at the total film thickness $d_{total}$ is obtained (S106) to judge whether the periodical length of the film thickness is shifted from a predetermined reference value, e.g., the reference value of 278 nm at Γ=0.40. If it is shifted from the reference value, the Γ value is optimized to change the periodical length of the film thickness and Γ value (to perform setting again) and thereafter the above-described Steps are repeated.

Namely, in manufacturing a mask blank, in addition to the periodical length of the repetitive stack unit of the multi-layer film structure, the Γ value, which is the film thickness ratio between the Si layer and Mo layer constituting the repetitive stack unit, is also set in such a manner that the center of FWHM of the reflectance $R_{total}$ via thirteen surfaces in total becomes coincident with the center wavelength of extreme ultraviolet light (refer to FIG. 14) to configure the multi-layer film structure.

As the exposure mask is constituted of the mask blank obtained in this manner, the allowable variation width of the total film thickness $d_{total}$ can be broadened. It can therefore be expected that the productivity of mask blanks (exposure masks) is improved so that it is possible to realize an improvement in manufacturing efficiency of semiconductor devices, the reduction of manufacturing costs and the like. Furthermore, also in this case, since it is possible to suppress the intensity of extreme ultraviolet light from being attenuated considerably, a sufficient reaching energy for exposure to resist can be retained and it is possible to avoid beforehand a degradation in manufacture quality and the like of semiconductor devices.

In this description, although optimization of the Γ value is used by way of example when a mask blank is manufactured, it is obvious that the Γ value is optimized when a reflection mirror is manufactured. Namely, the optimization of the Γ value described in the embodiment is applicable to all types of reflectors for extreme ultraviolet light. Therefore, remarkable effects can be obtained relative to the film thickness variation of, for example, a half tone phase shift mask blank, by optimizing the Γ value.

Description will be made of application of the optimization of a Γ value of a half tone phase shift mask blank. As an example of a half tone phase shift, a mask blank of a multi-layer film structure for reflecting extreme ultraviolet light is used on which a TaN film of extreme ultraviolet light absorbing material is formed with a Ru film being interposed therebetween. This half tone phase shift mask provides a phase shift mask function by setting a phase difference of 180 degrees between light reflected from the reflection surface of the mask blank and light reflected from the surface of the TaN film. For example, the film thicknesses giving a phase difference of 180 degrees are 13 nm for the R film and 30 nm for the TaN film.

Figure 17:
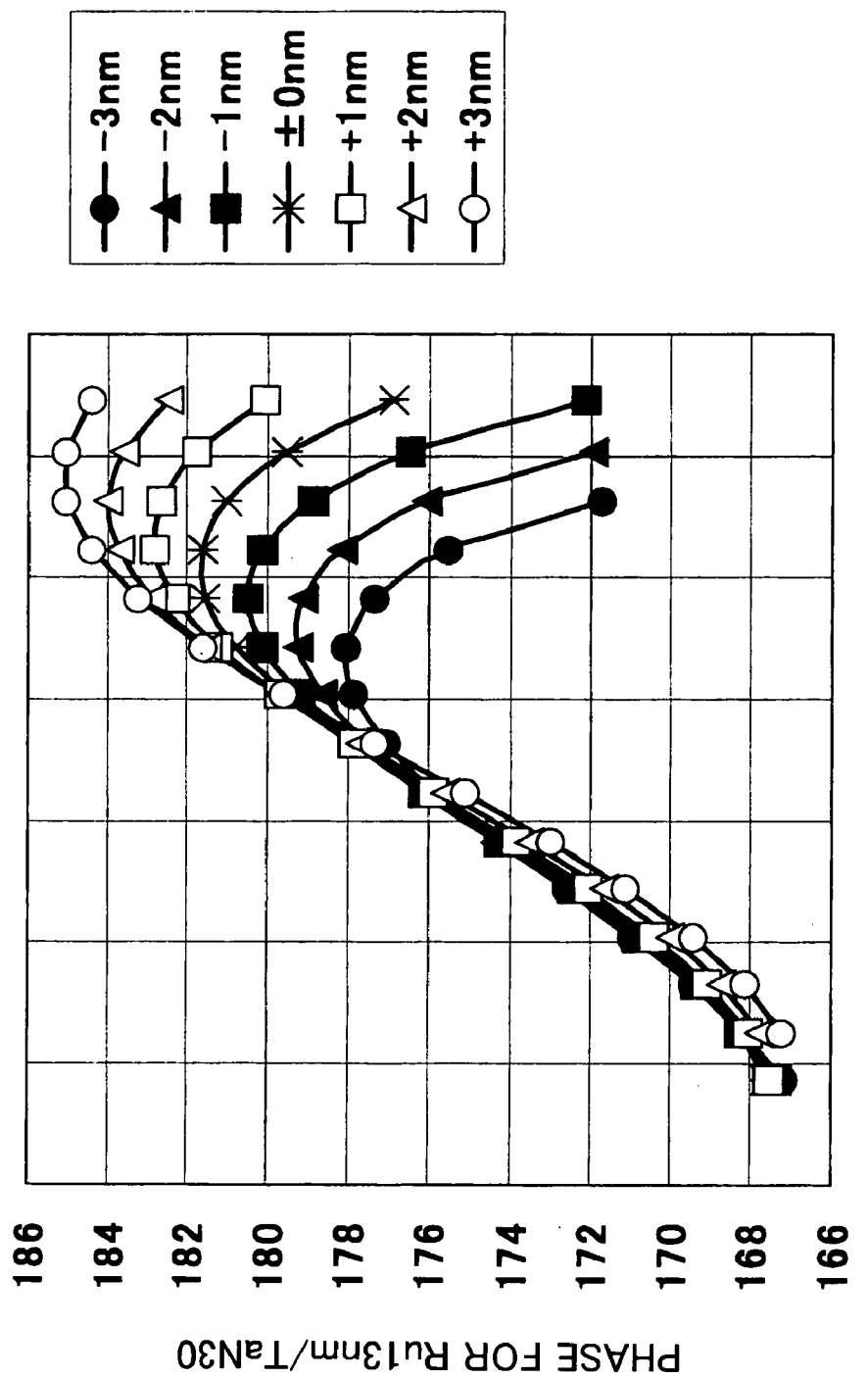
FIG. 17 is an illustrative diagram showing an example of TE wave phase difference distributions of a half tone phase shift mask at respective wavelengths, relative to a variation of total film thicknesses when a Γ value is not optimized.
Figure 18:
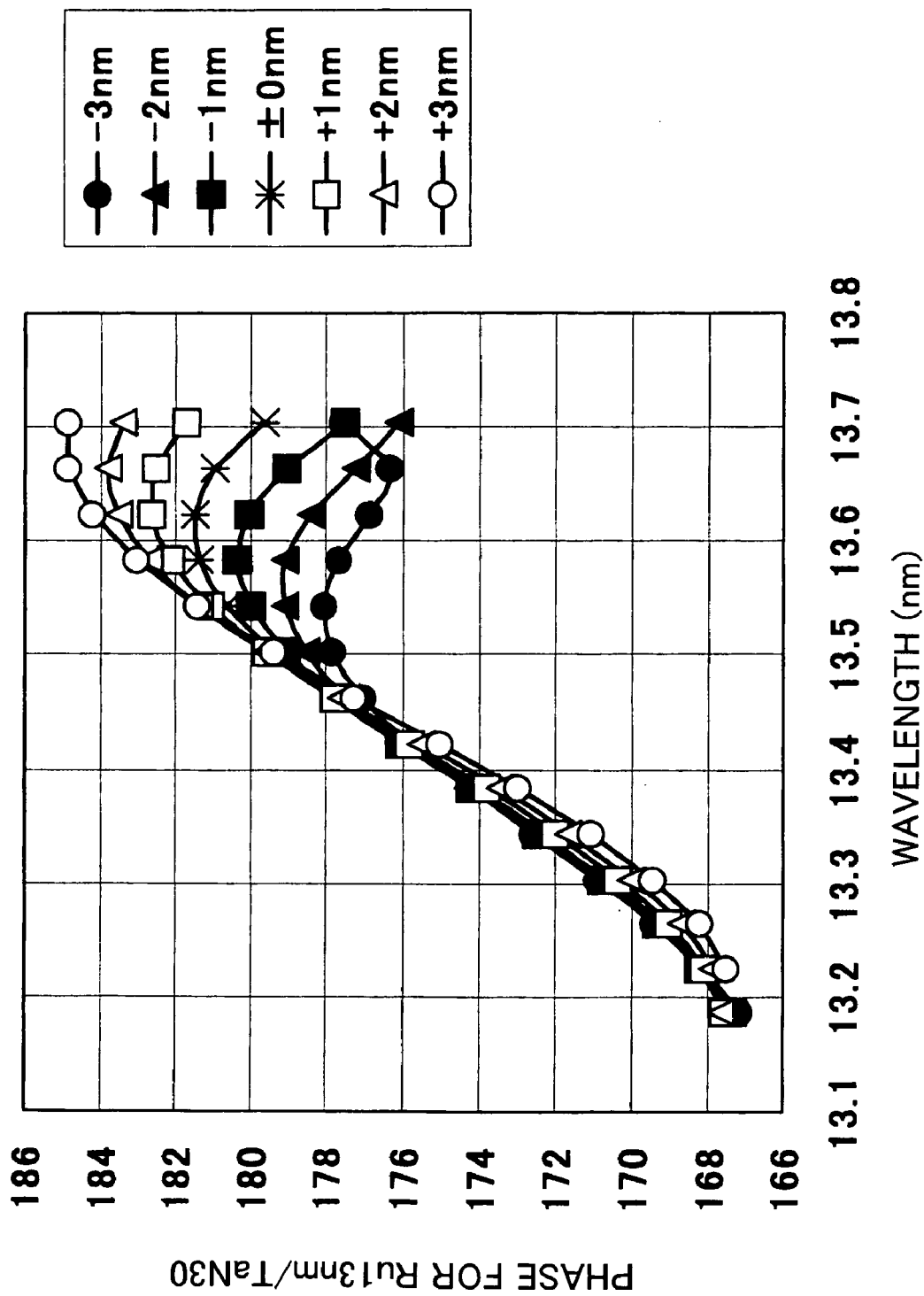
FIG. 18 is an illustrative diagram showing an example of TM wave phase difference distributions of a half tone phase shift mask at respective wavelengths, relative to a variation of total film thicknesses when a Γ value is not optimized.

FIGS. 17 and 18 show the wavelength dependency of a phase difference when the Γ value is not optimized relative to the variation of the total film thicknesses $d_{total}$ of mask blanks of the above-described half tone phase shift mask. FIG. 17 is a diagram showing the phase difference distribution of TE waves, and FIG. 18 is a diagram showing the phase difference distribution of TM waves. It can be seen from the examples shown in these drawings that the phase difference range is from 167 degrees to 184 degrees if the Γ value is not optimized.

Figure 19:
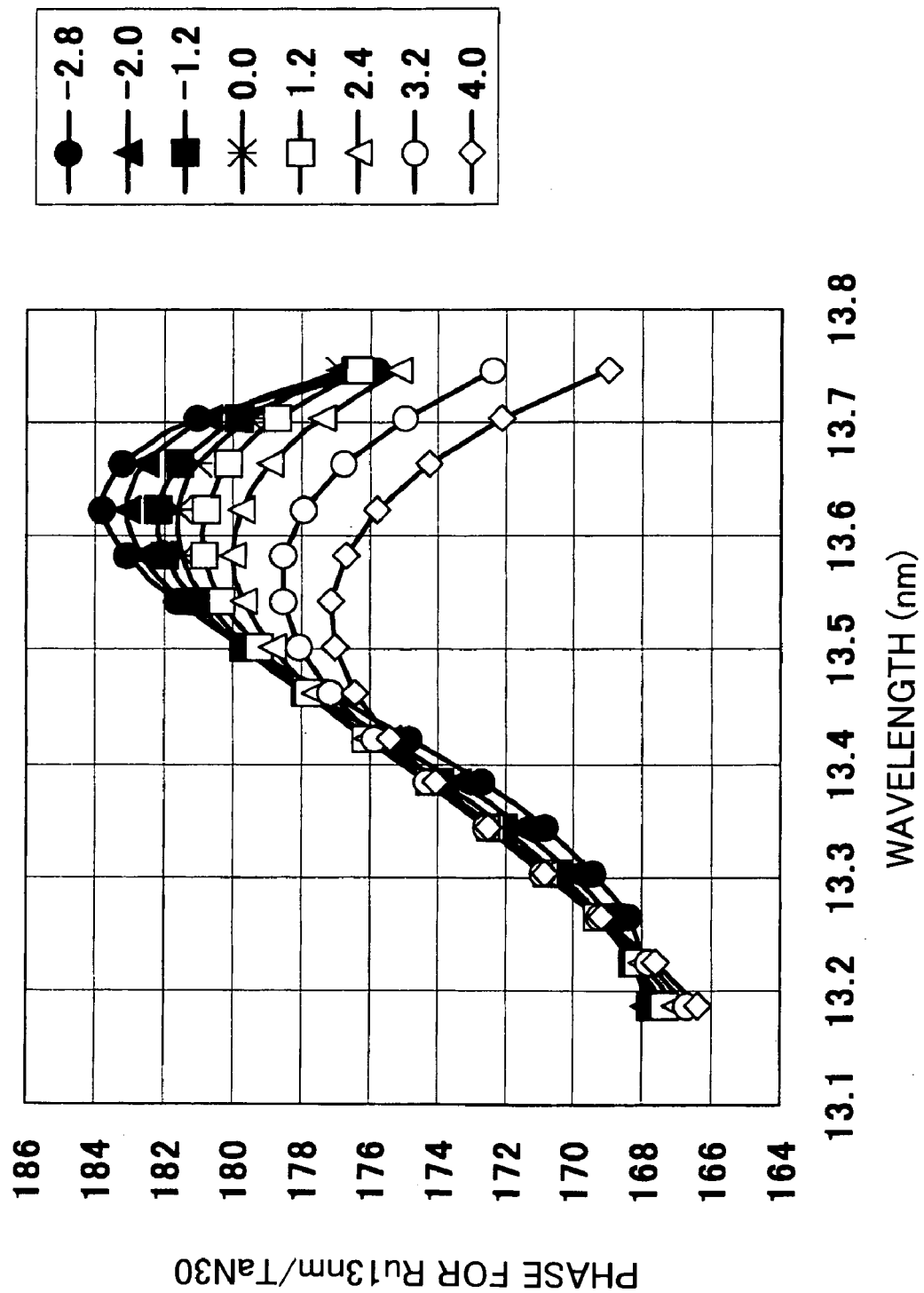
FIG. 19 is an illustrative diagram showing an example of TE wave phase difference distributions of a half tone phase shift mask at respective wavelengths, relative to a variation of total film thicknesses when a Γ value is optimized.
Figure 20:
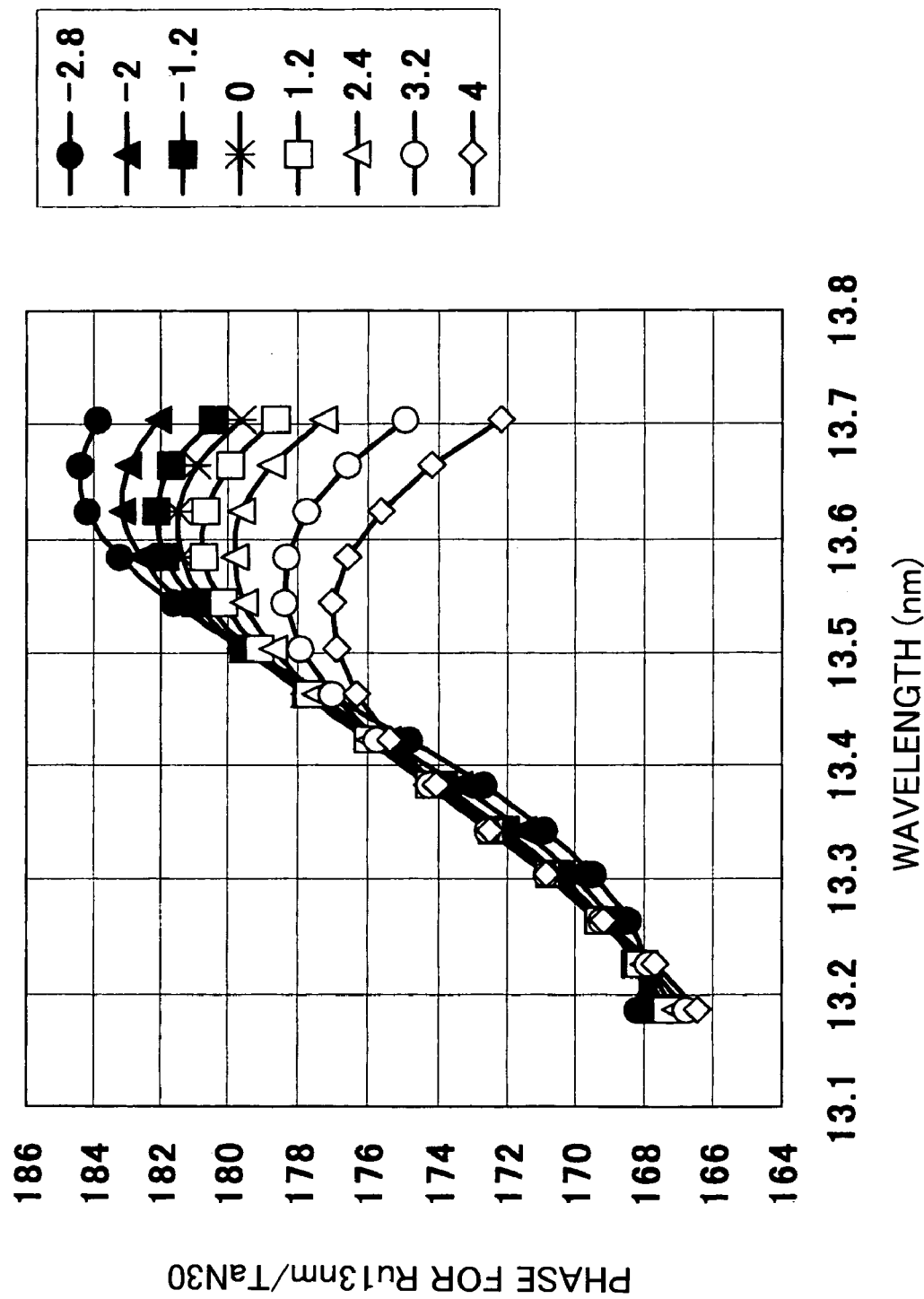
FIG. 20 is an illustrative diagram showing an example of TM wave phase difference distributions of a half tone phase shift mask at respective wavelengths, relative to a variation of total film thicknesses when a Γ value is optimized.

In contrast, FIGS. 19 and 20 show the wavelength dependency of a phase difference when the Γ value is optimized relative to the variation of the total film thicknesses $d_{total}$ of mask blanks of the half tone phase shift mask. FIG. 19 is a diagram showing the phase difference distribution of TE waves, and FIG. 20 is a diagram showing the phase difference distribution of TM waves. It can be seen from the examples shown in these drawings that the phase difference distribution width is improved from 167 degrees to 183 degrees if the Γ value is optimized. Namely, by optimizing the Γ value, the phase difference distribution width is improved by about 6%.

Figure 21:
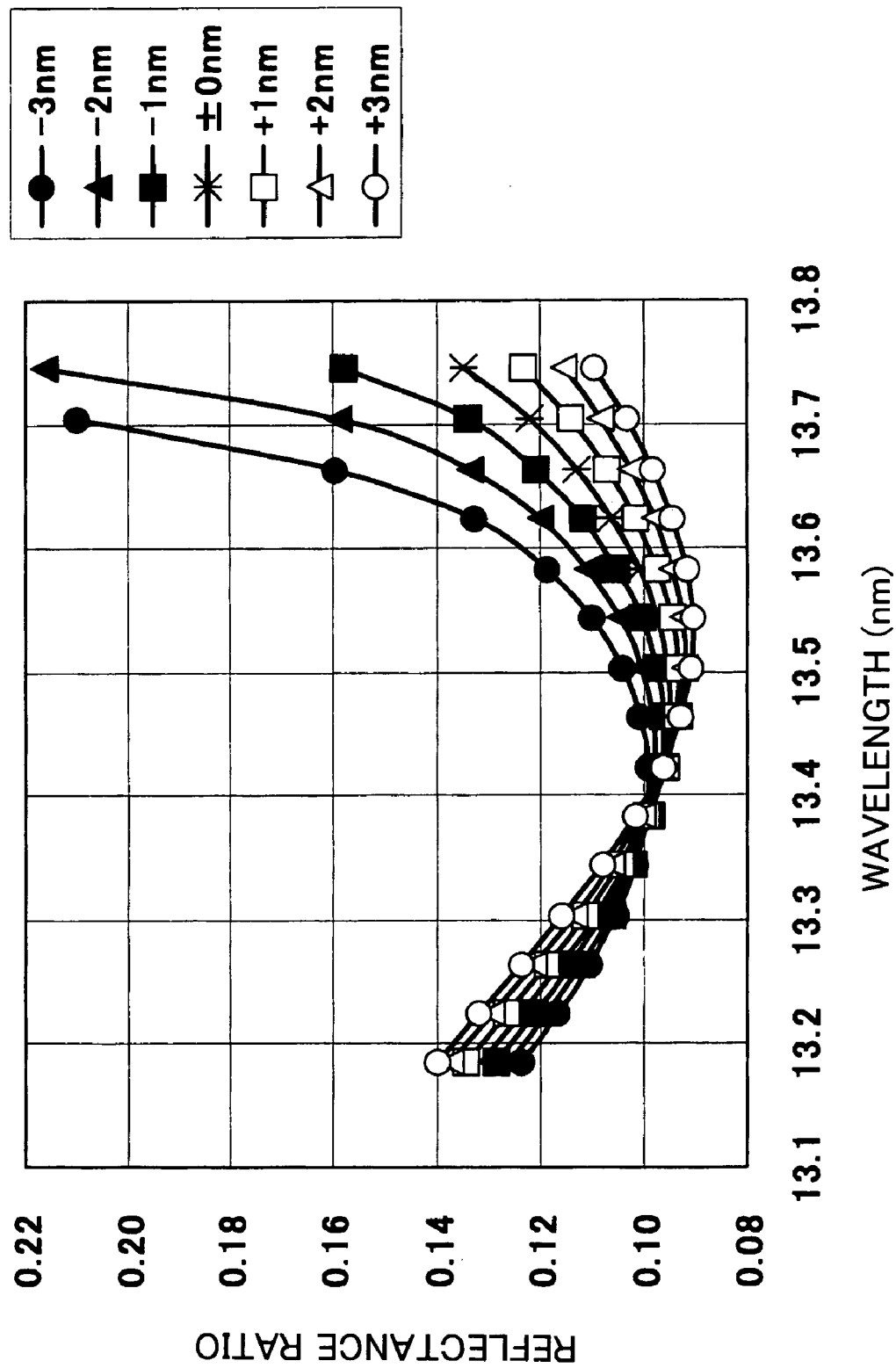
FIG. 21 is an illustrative diagram showing an example of reflectance ratio distributions of a half tone phase shift mask at respective wavelengths, relative to a variation of total film thicknesses when a Γ value is not optimized.
Figure 22:
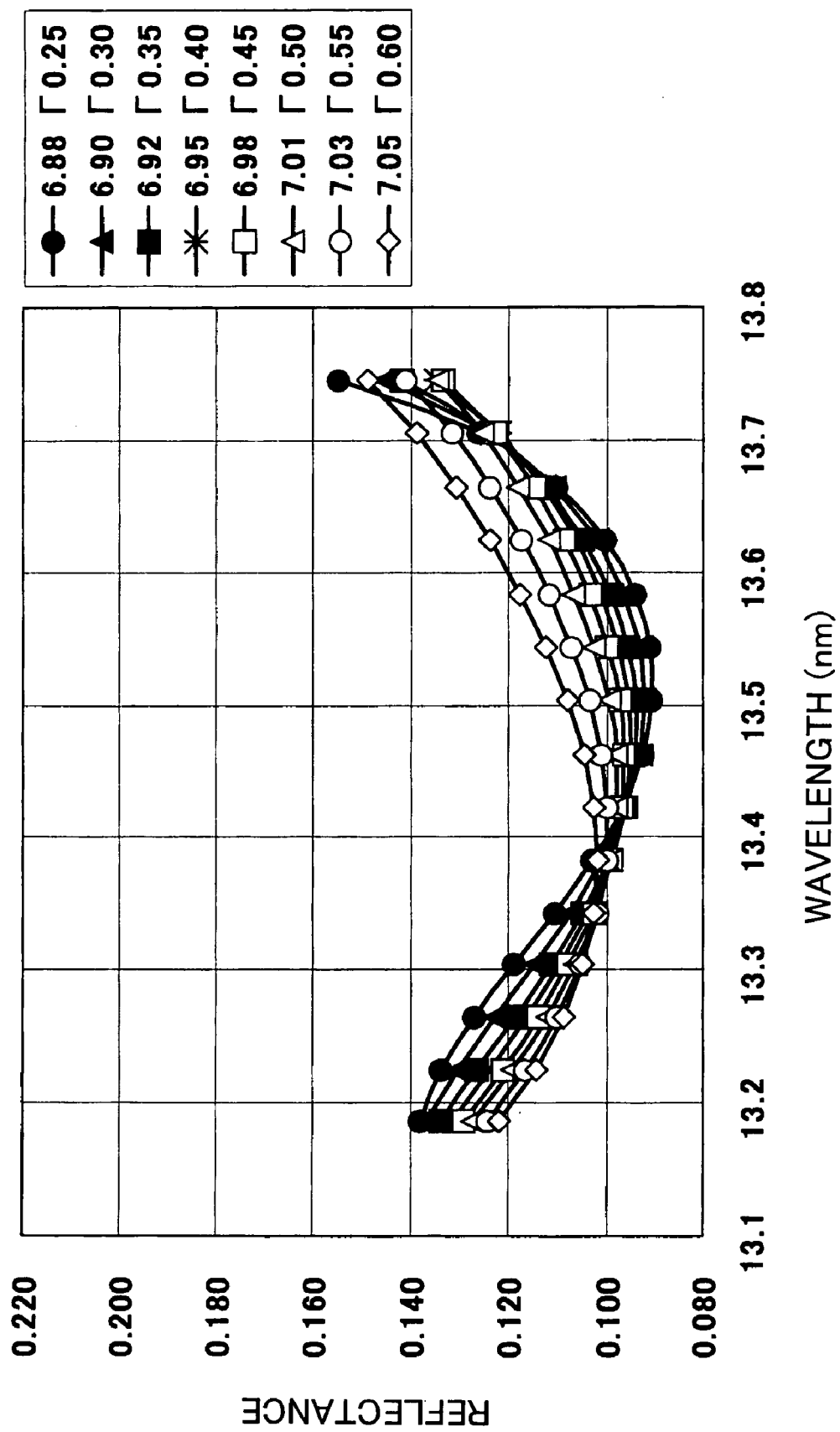
FIG. 22 is an illustrative diagram showing an example of reflectance ratio distributions of a half tone phase shift mask at respective wavelengths, relative to a variation of total film thicknesses when a Γ value is optimized.

FIG. 21 shows a ratio $T_{ratio}=T_{(Ru+TaN)}/T_{blank}$ of a reflectance $T_{(R+TaN)}$ of the R film and TaN film when the Γ value is not optimized relative to the variation of the total film thicknesses $d_{total}$ of mask blanks to a reflectance $T_{blank}$ of mask blanks. This ratio $T_{ratio}$ is desired to have a small distribution, similar to the phase difference distribution. In contrast, FIG. 22 shows the ratio $T_{ratio}$ when the Γ value is optimized. From the comparison of these examples shown in the drawings, it can be seen that the wavelength dependency of the reflectance ratio becomes small by optimizing the Γ value.

Namely, as the optimization of the Γ value is applied to the blank of the half tone phase shift mask, a phase shift mask can be realized wherein not only the variation width of the total film thickness $d_{total}$ is broadened, but also the phase difference distribution and reflectance ratio distribution are small.

Figure 23:
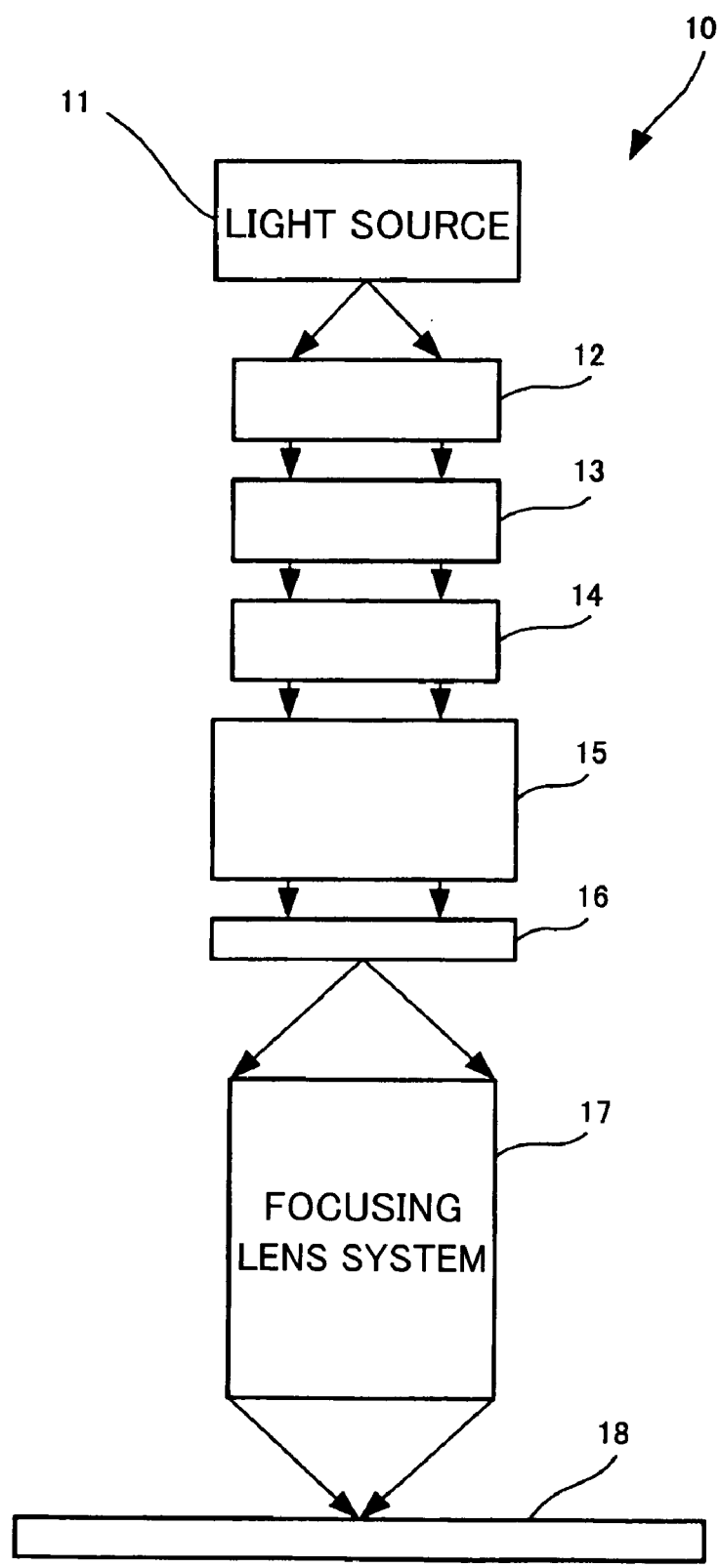
FIG. 23 is a schematic diagram showing an example of the outline structure of an exposure apparatus.

In the above description, although the exposure apparatus constituted of thirteen reflection surfaces in total is used by way of example, the invention is also applicable to exposure of different types. FIG. 23 is a diagram showing an example of the outline structure of another exposure apparatus. In an exposure apparatus 10 in the example shown in the drawing, exposure light output from a light source 11 of extreme ultraviolet light is separated by a beam splitter 12, narrowed to a proper angle by a prism unit 13 and passes through a fly eye lens 14 to form modified illumination or annular illumination to be described later. This light is reflected by (or transmitted through) a mask pattern of a reticle 16 via an illumination lens system 15, converged by a focussing lens system 17, and becomes obliquely incident illumination for resist coated on a wafer 18. Instead of using the beam splitter 12 and prism unit 13, the modified illumination or half tone annular illumination may be formed by using a filter which transmits an amount of light equal to or larger than some degree through a light source center and its nearby area. Further, if a mercury lamp is used as the light source 3 shown in FIG. 2, an exposure apparatus with an i-line stepper can be realized. The invention is not limited to this, but other types of exposure apparatuses may also be used such as a g-line stepper, a KrF excimer laser stepper, and an ArF excimer laser stepper.

The exposure beam is not limited only to extreme ultraviolet light but other beams may be used such as ultraviolet light, an electron beam, an X-ray, a radial ray, a charged particle ray, and a light ray, with which the present invention can be properly reduced in practice.

For example, one electron beam exposure technique is low energy electron proximity projection lithography (LEEPL). LEEPL uses a stencil mask made of a membrane having a thickness of several hundreds nm and formed with holes corresponding to a device pattern. A mask is disposed just above a wafer at a distance of several tens, μm between the mask and wafer. The pattern area of the mask is scanned with an electron beam at several tens keV to transfer the pattern to the wafer (T. Utsumi, Journal of Vacuum Science and Technology B17, 2897 (1999)). In this manner, an electron beam emitted from a low acceleration electron gun passes through an aperture, is changed to a parallel beam by a condenser lens, and passes through a deflector to be irradiated on a wafer via the mask. Also in this case, by using a mask described in the present invention, it becomes possible to properly deal with a micro fine pattern width and pattern pitch of a transfer image so that the present invention can contribute to the improvement on the performance of semiconductor devices.

There is a method of supporting a small segment membrane by a beam structure (grid structure). This is used by a mask of SCALPEL (scattering with angular limitation in projection electron-beam lithography), PREVAIL (projection exposure with variable axis immersion lenses) and an EB stepper (for example, L. R. Harriott, Journal of Vacuum Science and Technology B15, 2130 (1997); H. C. Pfeiffer, Japanese Journal of Applied Physics 34, 6658 (1995)). With SCALPEL, an electron beam emitted from a low acceleration electron gun passes through an aperture, is changed to a parallel beam by a condenser lens, and passes through a deflector to be irradiated to a wafer via a mask. With PREVAIL, a condenser lens, a reticle, a first projection lens, a crossover aperture, a second projection lens, a sample, and a lens under the sample are sequentially arranged from an electron source side to transfer a reticle pattern to the sample. Also in these cases, by using a mask described in the present invention, it becomes possible to properly deal with a micro fine pattern width and pattern pitch of a transfer image so that the present invention can contribute to the improvement of the performance of semiconductor devices.

Even if not only extreme ultraviolet light, but also ultraviolet light, an electron beam, an X-ray, a radial ray, a charged particle ray or a light ray is used as the exposure beam, a line width variation and a pattern position misalignment after exposure to a wafer can be minimized by applying the present invention. Therefore, it becomes possible to properly deal with a micro fine pattern width and pattern pitch of a transfer image so that the present invention can contribute to the improvement of the performance of semiconductor devices.

INDUSTRIAL APPLICABILITY

As described above, according to a reflector for extreme ultraviolet light, its manufacture method, a phase shift mask, an exposure apparatus and a semiconductor manufacture method of the present invention, the wavelength dependency of a reflectance via a plurality of reflection surfaces can be made coincident with the center wavelength of exposure light of extreme ultraviolet light. Accordingly, it is possible to retain a sufficient reaching energy for exposure of a subject to be exposed. Further, if an optimum Γ value is selected, the allowable variation width of a film thickness of the reflector can be broadened so that a sufficient energy reaching an exposure subject can be retained without degrading the productivity and the like of reflectors.

The invention claimed is:

1. A reflector for exposure light, characterized in that:
said reflector for exposure light has a multi-layer film structure that a plurality of layers are repetitively stacked in the same order;

a periodical length of a repetitive stack unit of said multi-layer film structure is set so that a center of full width at half maximum of a reflectance via a predetermined number of reflectors becomes coincident with a center wavelength of said exposure light to be reflected, and said reflector for exposure light is used when said exposure light is exposed to a subject to be exposed in a lithography process for manufacture of a semiconductor device.

2. A reflector for exposure light according to claim 1; characterized in that:

in addition to said periodical length of said repetitive stack unit of said multi-layer film structure, a film thickness ratio between a plurality of layers constituting said repetitive stack unit is set so that said center of full width at half maximum of said reflectance via said predetermined number of reflectors becomes coincident with said center wavelength of exposure light to be reflected.

3. A reflector for exposure light according to claim 1; wherein said exposure light is any one of extreme ultraviolet light, ultraviolet light, an electron beam, an X-ray, a charged particle ray, a radial ray, or a visible light.

4. A reflector for exposure light according to claim 1; wherein said multi-layer film structure is made by stacking constituted of Si and Mo in the same order.

5. A reflector for exposure light according to claim 4; wherein said multi-layer film structure is stacked on a glass substrate comprising $SiO_2$ from said glass surface toward the surface of said reflector.

6. A method of manufacturing a reflector for exposure light, characterized in that;

providing a multi-layer film structure made by repetitively stacking a plurality of layers in the same order formed by setting a periodical length of a repetitive stack unit of said multi-layer film structure and a film thickness ratio between a plurality of layers constituting said repetitive stack unit in such a manner that a center of full width at half maximum of a reflectance via a predetermined number of reflectors becomes coincident with a center wavelength of exposure light to be reflected.

7. A method of manufacturing a reflector for exposure light according to claim 6;

wherein said exposure light is any one of extreme ultraviolet light, ultraviolet light, an electron beam, an X-ray, a charged particle ray, a radial ray, or a visible light.

8. A method of manufacturing a reflector for exposure light according to claim 6;

wherein said multi-layer film structure is made by stacking constituted of Si and Mo in the same order.

9. A method of manufacturing a reflector for exposure light according to claim 8;

wherein said multi-layer film structure is stacked on a glass substrate comprising $SiO_2$ from said glass surface toward the surface of said reflector.

10. A mask used when exposure light is exposed to a subject to be exposed in a lithography process for manufacture of a semiconductor device, said mask characterized by;

including a reflector portion having a multi-layer film structure made by repetitively stacking a plurality of layers in the same order and an absorption film portion covering the reflector portion with a predetermined pattern;

wherein said mask is structured so that there is a phase difference between reflection light of exposure light from said reflector portion and reflection light of said exposure light from said absorption film portion, and that in said reflection portion a periodical length of a repetitive stack unit of said multi-layer film structure and a film thickness ratio between the plurality of layers constituting said repetitive stack unit are set so that a center of full width at half maximum of a reflectance via a predetermined number of reflectors becomes coincident with a center wavelength of exposure light to be reflected.

11. A mask according to claim 10, wherein said mask is a phase shift mask.

12. A mask according to claim 10;

wherein said exposure light is any one of extreme ultraviolet light, ultraviolet light, an electron beam, an X-ray, a charged particle ray, a radial ray, or a visible light.

13. A mask according to claim 10;

wherein said multi-layer film structure is made by stacking constituted of Si and Mo in the same order.

14. A mask according to claim 12;

wherein said multi-layer film structure is stacked on a glass substrate comprising $SiO_2$ from said glass surface toward the surface of said reflector.

15. A mask according to claim 10;

wherein said buffer layer comprises Ru (ruthenium).

16. A mask according to claim 15;

wherein a light reflection surface side of said reflector is covered with TaN (tantalum nitride).

17. An exposure apparatus used when exposure light is exposed to a subject to be exposed in a lithography process for manufacture of a semiconductor device, characterized by:

including a predetermined number of reflectors for exposure light, said reflector having a multi-layer film structure made by repetitively stacking a plurality of layers in the same order;

wherein in said reflector for exposure light a periodical length of a repetitive stack unit of said multi-layer film structure and a film thickness ratio between the plurality of layers constituting said repetitive stack unit are set so that a center of full width at half maximum of a reflectance via said predetermined number of reflectors becomes coincident with a center wavelength of exposure light to be reflected.

18. An exposure apparatus according to claim 17;

wherein said exposure light is any one of extreme ultraviolet light, ultraviolet light, an electron beam, an X-ray, a charged particle ray, a radial ray, or a visible light.

19. A semiconductor device manufacture method characterized by:

including a reflector portion having a multi-layer film structure made by repetitively stacking a plurality of layers in the same order and an absorption film portion covering the reflector portion with a predetermined pattern;

wherein exposure light is exposed to a subject to be exposed in a lithography process for manufacture of a semiconductor device;

using a mask structured so that there is a phase difference between reflection light of exposure light from said reflector portion and reflection light of said exposure light from said absorption film portion, and that in said reflection portion a periodical length of a repetitive stack unit of said multi-layer film structure and a film thickness ratio of said plurality of layers constituting said repetitive stack unit are set so that a center of full width at half maximum of a reflectance via a predetermined number of reflectors becomes coincident with a center wavelength of exposure light to be reflected.

20. A semiconductor device manufacture method according to claim 19;

wherein said exposure light is any one of extreme ultraviolet light, ultraviolet light, an electron beam, an X-ray, a charged particle ray, a radial ray, or a visible light.

* * * * *

UNITED STATES PATENT AND TRADEMARK OFFICE
CERTIFICATE OF CORRECTION

| | | |
|---|---|---|
| PATENT NO. | : 7,170,683 B2 | Page 1 of 1 |
| APPLICATION NO. | : 10/510725 | |
| DATED | : January 30, 2007 | |
| INVENTOR(S) | : Minoru Sugawara | |

It is certified that error appears in the above-identified patent and that said Letters Patent is hereby corrected as shown below:

Title Page:
Item (54) should be read as follows:
-- REFLECTOR FOR EXPOSURE LIGHT AND ITS MANUFACTURE METHOD, MASK, EXPOSURE APPARATUS AND SEMICONDUCTOR DEVICE MANUFACTURE METHOD --.

Signed and Sealed this

Seventh Day of August, 2007

JON W. DUDAS
*Director of the United States Patent and Trademark Office*